US007791508B2

(12) United States Patent
Wegener

(10) Patent No.: US 7,791,508 B2
(45) Date of Patent: Sep. 7, 2010

(54) ENHANCED CONTROL FOR COMPRESSION AND DECOMPRESSION OF SAMPLED SIGNALS

(75) Inventor: Albert W Wegener, Portola Valley, CA (US)

(73) Assignee: Samplify Systems, Inc., Santa Clara, CA (US)

(*) Notice: Subject to any disclaimer, the term of this patent is extended or adjusted under 35 U.S.C. 154(b) by 22 days.

(21) Appl. No.: 12/392,418

(22) Filed: Feb. 25, 2009

(65) Prior Publication Data

US 2009/0160685 A1 Jun. 25, 2009

Related U.S. Application Data

(63) Continuation of application No. 11/856,611, filed on Sep. 17, 2007, now Pat. No. 7,522,074.

(51) Int. Cl.
*H03M 7/00* (2006.01)

(52) U.S. Cl. ............................ 341/61; 341/65; 341/67; 341/155

(58) Field of Classification Search .................. 341/61, 341/65, 67, 155
See application file for complete search history.

(56) References Cited

U.S. PATENT DOCUMENTS 4,866,647 A 9/1989 Farrow
4,969,040 A 11/1990 Gharavi
5,067,015 A 11/1991 Combridge et al.
5,302,950 A 4/1994 Johnson et al.
5,497,435 A 3/1996 Berger
7,009,533 B1 * 3/2006 Wegener ...................... 341/76
7,071,852 B1 * 7/2006 Wegener ...................... 341/61
7,088,276 B1 8/2006 Wegener
7,292,164 B1 * 11/2007 Wegener et al. ............... 341/76

OTHER PUBLICATIONS

Arbeiter, J., "Multidimensional video image processing architecture", Optical Engineering 25(7), pp. 875-880, Jul. 1986.
Burt, P. and E. Adelson. "The Laplacian Pyramid as a Compact Image Code", IEEE Transactions on Communications, vol. COM-31, No. 4, pp. 532-540, Apr. 1983.

(Continued)

*Primary Examiner*—Khai M Nguyen
(74) *Attorney, Agent, or Firm*—Carolyn Koenig; Haynes Beffel & Wolfeld LLP

(57) ABSTRACT

Control of signal compression is coordinated by selectively modifying control parameters affecting the bit rate, sample rate, dynamic range and compression operations. Selected control parameters are modified according to a control function. The control function can include a ratio parameter that indicates the relative or proportional amounts of change to the control parameters. Alternatively, the control function can be represented in a lookup table with values for the selected control parameters related by the control function. Downsampling the input signal samples according to a sample rate control parameter is followed by upsampling to the original sample rate. Errors are calculated between the upsampled and original signal samples. Encoding of the downsampled signal samples and the error samples is performed in accordance with a compression control parameter. The sample rate control parameter and compression control parameter are determined based on the control function.

25 Claims, 13 Drawing Sheets

OTHER PUBLICATIONS

Dick, C. and F. Harris, "FPGA Interpolators using Polynomial Filters", 8th International Conf. on Signal Processing Applications and Technology, Sep. 1998.

Harris, F. Multirate Signal Processing for Communication Systems. Prentice Hall, 2004, pp. 184-197.

Wang, L. and M. Goldberg, "Progressive Image Transmission using Vector Quantization on Images in Pyramid Form," IEEE Transactions on Communications, vol. 37, No. 12, pp. 1339-1349.

* cited by examiner 580a
528a (arrow pointing to row 3)

| Index | Sample Rate Parameter CP1 | Dynamic Range Parameter CP2 |
|---|---|---|
| 1 | 1.00 | 1.00 |
| 2 | 1.01 | 1.00 |
| 3 | 1.04 | 1.00 |
| 4 | 1.12 | 0.98 |
| • • • | • • • | • • • |
| 253 | 2.55 | 0.27 |
| 254 | 2.78 | 0.26 |
| 255 | 2.89 | 0.25 |
| 256 | 3.00 | 0.25 |
| 581a | 584a | 586a |

580b
528b (arrow pointing to row 509)

| Index | Sample Rate Parameter CP1 | Dynamic Range Parameter CP2 |
|---|---|---|
| 1 | 1.00 | 1.00 |
| 2 | 1.04 | 0.99 |
| 3 | 1.00 | 0.99 |
| 4 | 1.03 | 0.97 |
| • • • | • • • | • • • |
| 509 | 1.93 | 0.43 |
| 510 | 1.97 | 0.41 |
| 511 | 1.97 | 0.40 |
| 512 | 2.00 | 0.40 |
| 581b | 584b | 586b |

| 1100 Center Frequency | 1120 Frequency Band Indicator | 1130 Demux Control x(i), x(i-j) | 1140 Inverter Control | 1150 Derivative Sample |
|---|---|---|---|---|
| DC | 1 | x(i), x(i-1) | off | y(i) = f[x(i) - x(i-1)] |
| fs/6 | 2 | x(i), x(i-3) | on, -x(i - 3) | y(i) = f[x(i) - (- x(i-3))] 1152 |
| fs/4 | 3 | x(i), x(i-2) | on, -x(1 - 2) | y(i) = f[x(i) - (- x(i-2)] |
| fs/3 | 4 | x(i), x(i-3) | off | y(i) = f[x(i) - x(i-3)] |
| fs/2 | 5 | x(i), x(i-1) | on = (i - 1) | y(i) = f[x(i) - (- x(i-1)] |

Figure 11
Prior Art

ENHANCED CONTROL FOR COMPRESSION AND DECOMPRESSION OF SAMPLED SIGNALS

RELATED APPLICATIONS

This application is a continuation of U.S. patent application Ser. No. 11/856,611, filed on 17 Sep. 2007.

BACKGROUND OF THE INVENTION

1. Field of the Invention

The present invention relates to compression and decompression of sampled signals, particularly to applying coordinated control of two or more control parameters for the compression operations.

2. Description of Related Art

In a signal processing system, it may be necessary to apply lossy compression to the signal samples in order to accommodate a system constraint. Constraints, including limited storage capacity or limited data transfer bandwidth, can prevent storage and/or transfer of the entire bandwidth and dynamic range of the signal samples. Ideally, lossless compression can be applied before data storage or data transfer followed by decompression before additional signal processing. In lossless compression, the decompressed signal samples are identical to the original signal samples. If lossless compression does not give adequate reductions in the bit rate of the compressed signal, then lossy compression may be necessary to provide sufficient reduction of the bit rate. In lossy compression, the decompressed, or reconstructed, signal samples are similar, but not identical to, the original signal samples, creating distortion in the characteristics of the reconstructed signal. Lossy compression creates a tradeoff between the bit rate of the compressed signal samples and the distortion in the reconstructed signal samples. The signal characteristics that may be distorted include, but are not limited to, amplitude, frequency, bandwidth and signal-to-noise ratio (SNR). The availability of computing resources to implement the compression algorithm may also be a system constraint in some instances. In this situation, it is desirable to minimize the computing resources required by either lossless or lossy compression algorithms.

In this discussion, "dynamic range" refers to the range of magnitudes available to the signal samples. Dynamic range can be expressed using a linear scale or a logarithmic scale using units of decibels (dB). The relationship of the logarithmic scale and the linear scale follow the well known equation:

$$dB=20*\log_2(\text{magnitude}),$$

where magnitude is in arbitrary linear units, such as voltage. The present invention focuses on signal samples whose dynamic range is limited by the number of bits per sample. The "6 dB per bit" rule, known to those skilled in the art, indicates that each bit level provides 6 dB of dynamic range for signal samples. For example, eight bits per sample accommodates 48 dB of dynamic range. Initially an analog to digital converter (ADC) converts an original analog signal to digital signal samples. So an initial dynamic range of the signal samples depends on the bit width available from the ADC. A similar relationship exists for the dynamic range of digital samples that are converted from the digital to the analog domain by a digital to analog converter (DAC).

In this discussion, "real time" means a rate that is at least as fast as the sample rate of a digital signal. The term "real time" can be used to describe rates for processing, transfer and storage of the digital signal. The sample rate is the rate at which the ADC forms samples of the digital signal during conversion of an analog signal. When converting a digital signal to an analog signal, the sample rate is the rate at which the DAC forms the analog signal from the samples of the digital signal. The bit rate of an uncompressed sampled, or digital, signal is the number of bits per sample multiplied by the sample rate. The compression ratio is the ratio of the bit rate of the original signal samples to the bit rate of the compressed samples.

Current methods of signal data compression generally identify redundancies in the signal data and reduce the redundancies in order to compress the data. For instance, in transform encoding, an orthogonal transform such as a Discrete Cosine Transform (DCT) is applied to the signal samples to form transform coefficients. The transform coefficients are then encoded in order to compress the data. In this example, the redundancy is represented by the various frequencies of the basis functions of the transform and the corresponding transform coefficients. Compression is achieved by eliminating selected transform coefficients with low values, truncating in the frequency domain by eliminating coefficients above a certain cutoff frequency, reducing the bit width of the transform coefficients and/or quantizing the coefficients with larger step sizes requiring fewer bits per coefficient. After inverse transformation, the reconstructed signal samples are rarely identical to the original signal samples. If there was a truncation in the frequency domain, Gibbs' phenomenon (ripple) can cause unwanted oscillations in the time domain reconstructed signal samples. Amplitude distortion may also result from quantization of the transform coefficients. In the time domain, lossy compression can be accomplished by removing least significant bits (LSBs) or applying coarser quantization so that there are fewer quantization levels per sample resulting in fewer bits per sample. Quantization of time domain samples or frequency domain transform coefficients both cause distortion in the amplitude of the reconstructed signal samples compared with the original signal samples. In addition, applying coarser quantization will also increase quantization noise. Time domain compression methods also identify redundancies in the signal. For example, compression methods based on the well known Huffman encoding calculate a histogram of symbol frequencies. The symbols can correspond to original signal samples or differences between signal samples. Symbols with higher frequencies of occurrence are assigned shorter codes while those with lower frequencies of occurrence are assigned longer codes. Techniques such as prefix coding can be used to ensure that the stream of variable-length codes can be accurately decoded. A sequence of codes corresponding to the sequence of values is bit-packed to form a compressed sequence. A lossy compression method in the time domain includes calculating the differences between samples and coarsely quantizing the differences. When the differences are added back in during decompression, the resulting reconstructed signal samples will have amplitude distortion and increased quantization noise resulting in a lower SNR.

Those skilled in the art recognize that distortion is a result of lossy compression. In information theory, the familiar tradeoff between the compressed signal's bit rate and distortion in the reconstructed, or decompressed, signal is often represented by a rate-distortion curve. It would be advantageous to control which signal characteristics are affected by the distortion introduced by lossy compression. In one application, the bandwidth of the signal samples may be a more critical characteristic to preserve while in another application, the dynamic range may be more critical to preserve by minimizing amplitude distortion. In yet another application, a balance between distortion in the dynamic range and bandwidth is advantageous. For example, in spread spectrum signals, such as code division multiple access (CDMA), a narrowband signal is modulated by a spreading sequence such that the signal spectrum is distributed across a wide band of frequencies. For this example, it would be more important to preserve the bandwidth of the spread signal since all of its frequency components are needed for despreading. After despreading the signal back to its original narrowband form, it may be more important to preserve the signal amplitude.

Previous methods for controlling signal compression provide for control of various parameters. The most common control parameter is the bit rate of the compressed signal or the corresponding compression ratio. In the commonly owned U.S. Pat. No. 7,009,533 B1 (the '533 patent), entitled "Adaptive Compression and Decompression of Bandlimited Signals", dated Mar. 7, 2006, the present inventor describes algorithms for compression and decompression of certain bandlimited signals including control of compression. The '533 patent discloses controlling preprocessor and compressor operations in feedforward and feedback configurations and in response to user input. In the commonly owned U.S. Pat. No. 5,839,100 (the '100 patent), entitled "Lossless and Loss-Limited Compression of Sampled Data Signals", dated Nov. 17, 1998, the present inventor describes efficient algorithms for compression of sampled data signals without loss or with a controlled amount of loss that affects the signal's dynamic range.

The previous methods do not provide coordinated control over the relative distortions in signal characteristics. Coordinated control allows control of the tradeoffs among the relative signal distortions during signal compression. Improved control will enhance the performance and accuracy of the signal processing system. The present invention fulfills these needs and provides further related advantages as described in the following summary.

SUMMARY OF THE INVENTION

An object of the invention is to provide coordinated control of signal compression by determining control parameters affecting the sample rate, dynamic range and compression operations. Selected control parameters are determined according to a control function. The input signal samples are resampled according to a sample rate control parameter. The sample rate control parameter can also indicate no resampling. Resampling may change the bandwidth of the resampled signal samples compared with the input signal samples. The dynamic range of resampled signal samples is reduced according to a dynamic range control parameter to form modified signal samples. The dynamic range control parameter can also indicate that the resampled signal samples will not be adjusted. The resampling and dynamic range adjustment can be applied in any order. The modified signal samples are encoded to form compressed samples. The encoder can apply lossless or lossy encoding.

The control function can include a ratio parameter that indicates the relative or proportional amounts of change to the control parameters. When the selected control parameters are the sample rate control parameter and the dynamic range control parameter, the ratio parameter is used to determine the relative amounts of change for the resampler and dynamic range adjuster. The control function characteristics can also be represented by a lookup table that contains values corresponding to two or more selected control parameters related by the control function. The user can modify the control function characteristics or the ratio parameter.

A graphical user interface (GUI) for the selection of control function characteristics includes a scale with a pointer. One end of the scale represents a minimum change to a particular control parameter and the other end represents a minimum change to a different control parameter. The location of the pointer on the scale indicates a value for a control function characteristic or a ratio parameter. When the scale represents the sample rate control parameter and the dynamic range control parameter, the pointer location indicates a value for the ratio parameter or other control function characteristic that indicates the relative changes in these two control parameters. The scale allows the user to select and coordinate the relative amounts of change to be applied to the selected control parameters.

Another object of the invention is a resampler that provides additional compression in a lossless mode or a lossy mode. The resampler operates to downsample the input signal samples at a reduced sample rate. The downsampled signal samples are then upsampled to the original sample rate. The upsampled signal samples are subtracted from the original signal samples to form error, or residual, samples. The downsampled signal samples and error samples are encoded to form compressed samples. Alternatively, the downsampled signal samples and error samples can be attenuated or quantized to provide additional compression.

Another object of the invention is decompression of the compressed samples. The decompressor decodes the compressed samples to provide decoded signal samples and decoded error samples. The decoded signal samples are upsampled to the original sample rate. The decoded error samples are added to the upsampled signal samples to form the reconstructed signal samples at the original sample rate. The error signal can optionally be omitted from the compressed stream.

BRIEF DESCRIPTION OF THE DRAWINGS

FIG. 11 shows the operations that the programmable demultiplexer and programmable inverter perform based on the center frequency of the signal samples, in accordance with the prior art.

DETAILED DESCRIPTION

Figure 1:
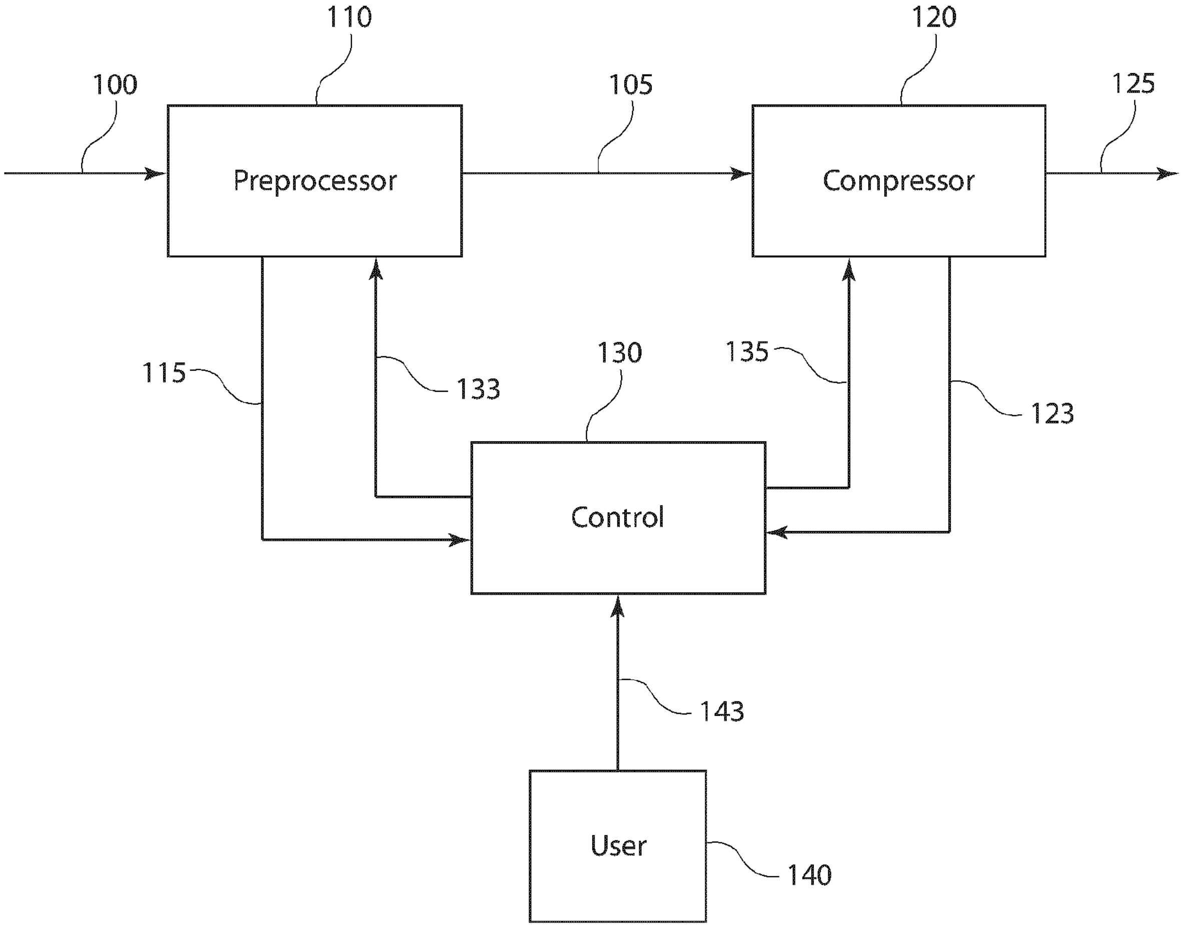
Figure 1 Prior Art
FIG. 1 is a block diagram of a signal compressor, in accordance with the prior art.

FIG. 1 is a block diagram of a signal compressor previously described in the '533 patent. The preprocessor 110 performs various selectable operations on the input signal samples 100 to produce preprocessed signal samples 105 with lowpass or other desired characteristics for the compression operations of the compressor 120. Some of the preprocessor operations will be described below with respect to FIG. 9. The preprocessor 110 can also measure various characteristics of the input signal samples 100, such as center frequency, noise floor and bandwidth. The compressor 120 applies selected operations that compress the preprocessed signal samples 105 including computing first or higher order differences, or derivatives, of the preprocessed signal samples 105, approximating certain signal samples through mathematical operations on other preprocessed signal samples 105, encoding (such as Huffman encoding) and bit-packing. The control module 130 produces control parameters for operations of the preprocessor 110 and the compressor 120. The control module 130 receives user input 143, measurements 115 of signal characteristics from the preprocessor 110 for feedforward control and measurements 123 of compression performance from the compressor 120 for feedback control. The user 140 can select control of signal quality, compression ratio or output bit rate in the compressed signal 125. The control module 130 calculates control parameters 133 for the preprocessor 110 and control parameters 135 for the compressor based on the measurements 115 and 123 and user input 143.

Figure 2:
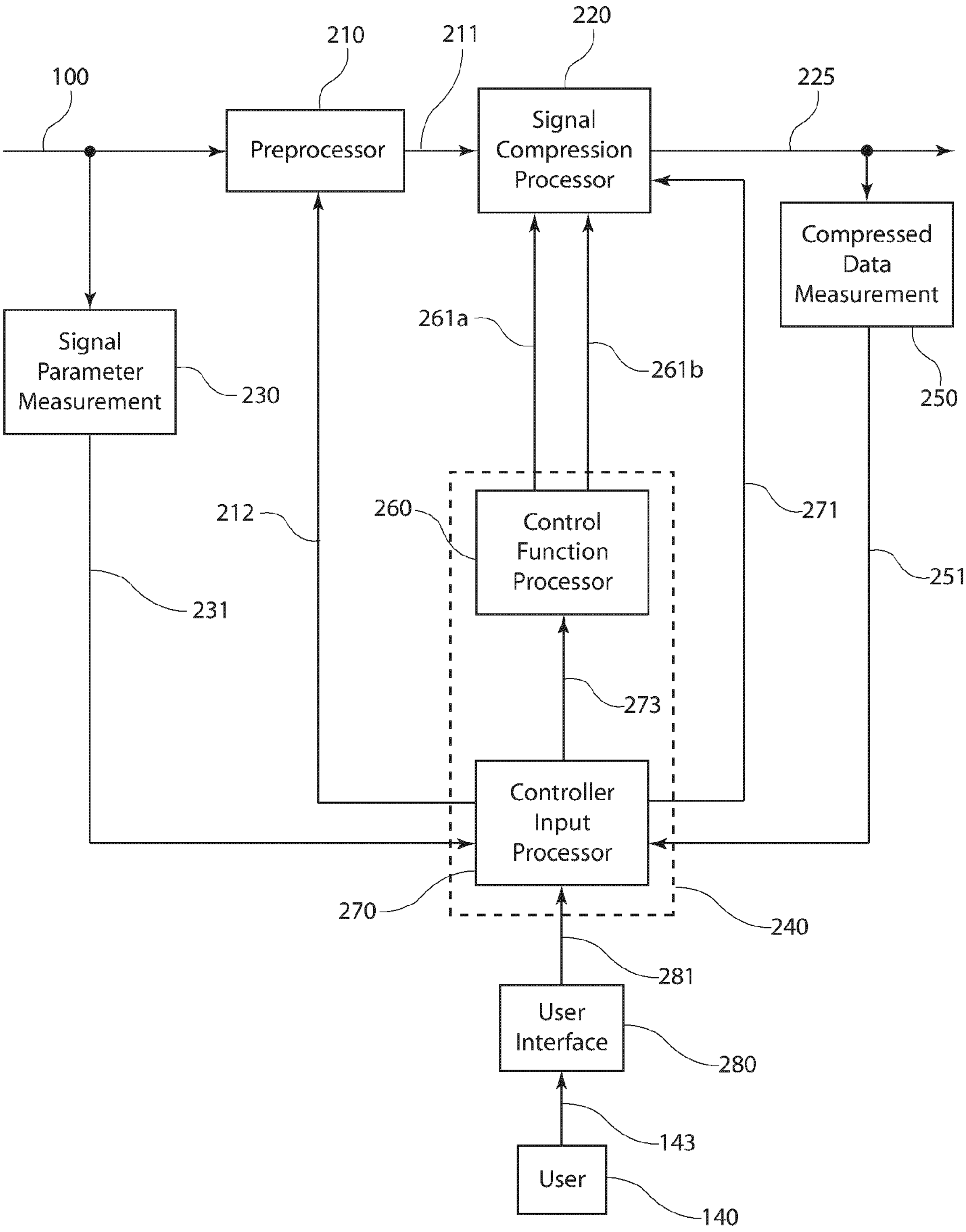
FIG. 2 is a block diagram of a signal compressor, in accordance with a preferred embodiment.

FIG. 2 is a block diagram of a signal compressor in accordance with a preferred embodiment of the present invention. An optional preprocessor 210 performs operations such as filtering, downconversion and other operations to prepare the input signal samples 100 for compression. The purpose of the preprocessor 210 is to produce preprocessed signal samples 211 with lowpass or other characteristics that can be effectively compressed by the signal compression processor 220. The preprocessor 210 produces one or more lowpass signal streams from an input signal by selectively reordering and selectively inverting signal samples 100. The preprocessor 210 receives control parameters 212 from the controller input processor 270. The operation of the preprocessor 210 will be described below with respect to FIG. 9. The signal compression processor 220 applies signal processing and compression operations described below with respect to FIG. 3 to form compressed samples 225. The controller 240 provides coordinated control parameters 261*a* and 261*b* for coordinated control of two different operators of the signal compression processor 220. The controller 240 includes a controller input processor 270 and a control function processor 260. The controller input processor 270 receives input 281 via a user interface 280 from a user 140. Processing modules for signal parameter measurement 230 and compressed data measurement 250 also provide inputs 231 and 251, respectively, to controller input processor 270. The signal parameter measurement module 230 is optional when the signal parameters 231 are known parameters. The compressed data measurement module 250 measures parameters of the compressed samples 225 to form feedback parameters for the controller 240. The user 140 selects feedback control of output bit rate or signal quality parameters. When feedback control of bit rate is desired, the measured parameter can be output bit rate of the compressed samples or the compression ratio. When feedback control of signal quality is desired, the feedback parameter is based on a signal quality parameter, such as signal to noise ratio, noise floor or bit error rate of decompressed, or reconstructed, signal samples corresponding to the compressed samples. For feedback control of the signal quality parameter, the compressed data measurement module 250 decompresses the compressed samples 225 and measures the signal quality parameter of the decompressed, or reconstructed, signal samples. The controller 260 applies any operations that convert the inputs 281, 231 and 251 into control parameters 261*a*, 261*b* and 271 for the signal compression processor 220. Depending upon the implementation, controller 260 may examine all inputs or a subset of inputs, and may generate all control parameters or a subset of control parameters. In a preferred embodiment, the control function processor 260 applies a control function to form coordinated control parameters 261*a* and 261*b* based on the parameters 273 received from the controller input processor 270. The control function provides coordinated control of distortions in selected signal characteristics, as described below with respect to FIG. 5. Controller input processor 270 can also perform calculations to produce an independent control parameter 271. The user interface 280 can include a graphical user interface described below with respect to FIG. 6.

Figure 3:
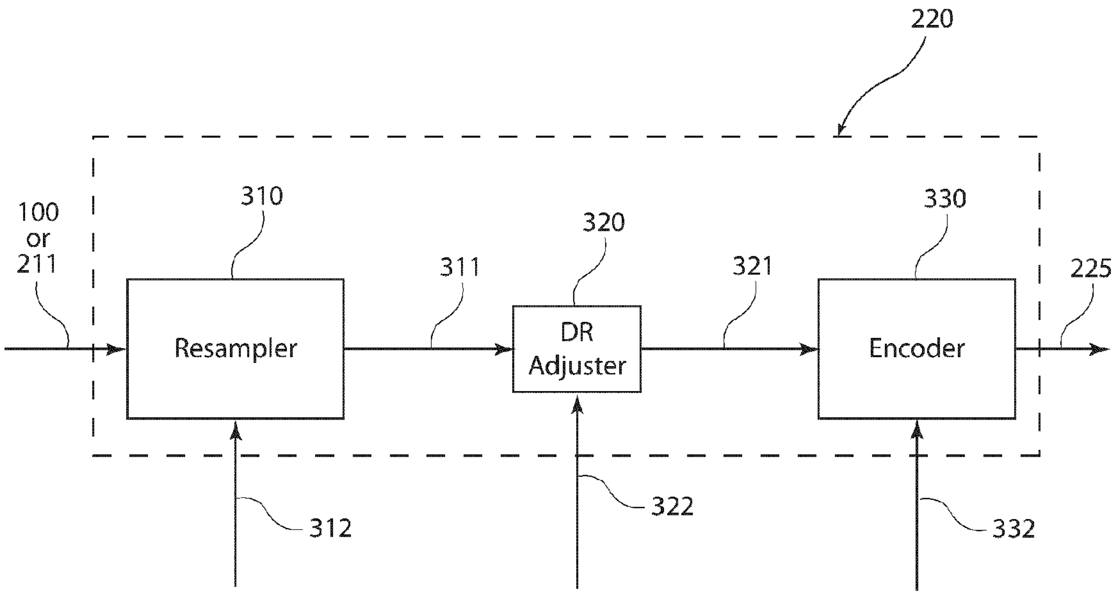
FIG. 3 is a block diagram of the signal compression processor, in accordance with a preferred embodiment.

FIG. 3 is a block diagram of an embodiment of the signal compression processor 220. The resampler 310 resamples the signal samples 100 to form resampled signal samples 311. Alternatively, if preprocessor 210 produces one or more signal sample streams, the resampler resamples each stream of preprocessed signal samples 211. The resampler 310 can downsample or upsample the signal samples 100 in accordance with a sample rate control parameter 312. The resampler 310 is described in greater detail below with respect to FIG. 4. Depending on the sample rate control parameter 312, the resampled signal samples 311 can have a reduced sample rate resulting in a lower bit rate compared to the bit rate of the input signal samples 100. The dynamic range adjuster 320 modifies the amplitudes of the resampled signal samples 311 in accordance with dynamic range control parameter 322 to produce modified signal samples 321. Depending on the dynamic range control parameter 322, the modified signal samples 321 can have a reduced dynamic range of amplitudes. The reduced amplitudes can be represented by fewer bits per sample resulting in a reduced bit rate for the modified signal samples 321 compared with that of the input signal samples 100. If the user selects the sample rate control parameter 312 and the dynamic range control parameter 322 for coordinated control, the control function processor 260 provides corresponding coordinated control parameters, 261*a* and 261*b*, respectively. If the user selects independent control, the controller input processor 270 provides independent control parameters 271 for the sample rate control parameter 312 and the dynamic range control parameter 322. The order of the operations of dynamic range adjuster 320 and resampler 310 can be reversed, i.e. the dynamic range adjuster 320 can perform its function on signal samples 100 or 211 before the resampler 310 is applied. The signal processing operations of resampling and dynamic range adjustment provide some compression of the signal samples 100 or 211.

The encoder 330 applies lossless or lossy compression in accordance with compression control parameter 332. The encoder 330 can apply bit-packing logic directly to the modified signal samples 321. To provide additional compression prior to bit-packing, encoder 330 can calculate first or higher order derivatives, or differences, of the modified signal samples 321 followed by encoding the derivatives using bit-packing logic. Alternatives for bit-packing logic include Huffman encoding, arithmetic encoding, block exponent encoding, Rice encoding, or other lossless encoding. The compression control parameter 332 can be provided to the encoder by the controller input processor 270 as independent control parameter 271. Alternatively, the control function processor 260 can provide coordinated control of the compression control parameter 332 in coordination with the sample rate control parameter 312 or the dynamic range control parameter 322 using coordinated control parameters 261*a* and 261*b*.

The preferred embodiment for the dynamic range adjuster 320 is a programmable multiplier that applies a factor in accordance with the dynamic range control parameter 322. To reduce the dynamic range, or attenuate, the signal samples, the value of the factor is less than one. The signal samples with reduced dynamic range are represented using fewer bits. In another embodiment, the dynamic range adjuster is a requantizer that maps the amplitudes of signal samples 100, 211 or 311, depending on which previous operations are selected, to representations having fewer bits per sample. In another embodiment, the dynamic range adjuster 320 uses a shift register that right shifts sample values to reduce a number of least significant bits (LSBs) in accordance with the dynamic range control parameter 322. The dynamic range adjuster 320 can remove LSBs based on the noise floor of the signal samples 100. If the noise floor is not known, the signal parameter measurement module 230 measures the noise floor in the signal samples 100. The controller input processor 270 calculates the dynamic range control parameter 322 based on the noise floor estimate to remove bits that are primarily noise. This approach is described in greater detail in the '533 patent with respect to FIG. 6 and FIGS. 18-26.

The resampler 310 can include a polyphase sampling filter or a Farrow filter, both well known to those skilled in the art. The Farrow filter is preferred because it requires fewer computations, resulting in ten to thirty percent fewer gates for an implementation compared to a polyphase filter. The Farrow filter is described by Cecil W. Farrow in U.S. Pat. No. 4,866,647 and in Chapter 7 of the book entitled "*Multirate Signal Processing for Communication Systems*" by fredric j harris, published by Prentice Hall PTR. The Farrow filter is effective for baseband or lowpass signals. If the input signal samples 100 are not at baseband, the preprocessor 210 can apply operations to produce lowpass or baseband signal samples. Alternatives include downconverting the signal samples 100 to baseband, lowpass filtering the signal samples 100 or separating the signal samples 100 into one or more streams of lowpass signal samples as described with respect to FIG. 9. The Farrow filter would then be applied to preprocessor output signal samples 211. Resampling using a Farrow filter can provide fractional changes in sample rate, whereas resampling using a polyphase sampling filter typically provides rational changes in sample rate according to the ratio m/n, where m and n are integers. The Farrow filter can also provide non-uniform sampling where the sample intervals between consecutive samples can vary in length. For non-uniform sampling, the resulting sample rate is an average sample rate for the resampled signal samples.

A preferred embodiment for decompression restores the original sample rate to the decompressed signal samples. Downsampled signal samples can be upsampled back to the original sample rate using a Farrow filter or a polyphase filter. A Farrow filter is preferred, as described below with respect to FIG. 4. In general, because resampling operations are most often implemented using arithmetic elements (adders, multipliers, and the like) having limited bit widths, upsampling the downsampled signal samples back to the original sample rate produces upsampled signal samples that differ slightly from the original signal samples. In some applications, it is desirable to remove the resampling error (also called the residual) in the upsampled signal samples. Additional operations in the signal compression processor 220 can measure and encode the resampling error for use by the decompressor.

Figure 4:
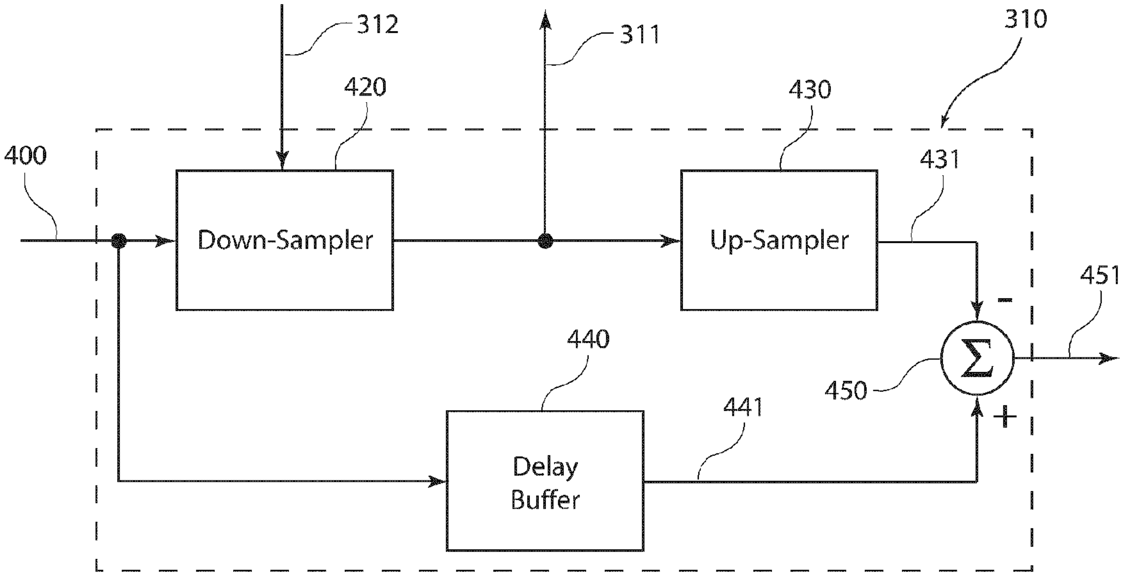
FIG. 4 is a block diagram of the resampler, in accordance with a preferred embodiment.

FIG. 4 is a block diagram of an alternative embodiment for the resampler 310 that includes determining the resampling error. This embodiment for the resampler 310 can be configured to provide lossless or lossy compression. The input samples 400 are the signal samples 100, the preprocessor output samples 211 or modified signal samples 321 produced by dynamic range adjuster 320 prior to resampling, depending on which previous operations are selected. The downsampler 420 applies a Farrow or polyphase filter to downsample the input samples 400 in accordance with the sample rate control parameter 312 to produce the resampled, or downsampled, signal samples 311. The upsampler 430 applies a Farrow or polyphase filter to upsample the downsampled signal samples 311 at the original sample rate to form upsampled signal samples 431. The upsampled signal samples have samples at the same points in time as the original input samples 400 for the downsampler 420, however the amplitudes of the upsampled signal samples 431 may not be identical to those of the corresponding input samples 400. The delay buffer 440 delays the input samples 400 to provide temporal alignment with the upsampled signal samples 431, compensating for processing delays in the downsampler 420 and the upsampler 430. The subtractor 450 subtracts each upsampled signal sample 431 from its corresponding time-aligned signal sample 441 to form a corresponding error sample 451. The error samples 451 are encoded by the encoder 330 or scaled by the dynamic range adjuster 320 prior to encoding. The downsampled signal samples 311 are also encoded by the encoder 330 or scaled by the dynamic range adjuster 320 prior to encoding. The encoded error samples and the encoded downsampled signal samples are included in the compressed samples 225. For a lossless compression mode, the encoder 330 applies lossless encoding to both the error samples 451 and the downsampled signal samples 311. For a lossy compression mode, dynamic range adjuster 320 and/or the encoder 330 can apply lossy operations to the downsampled signal samples 311 and/or the error samples 451. Lossy compression also results from not calculating or not encoding the error samples 451.

The control function processor 260 provides coordination of at least two control parameters selected by the user. Coordination of the selected control parameters allows some control of the types of distortion that result from the corresponding compression operations. The control function processor 260 applies a control function to determine changes in the selected control parameters. The characteristics of the control function can be selected by the user. Characteristics of the control function can be represented by a ratio parameter, a lookup table representing values of the control function characteristics or a combination of both.

In a preferred embodiment, the control function processor 260 includes a ratio parameter. The ratio parameter relates the change to a first control parameter to the change in a second control parameter. The change for each control parameter is calculated by multiplying a change factor by a corresponding step size. Changes in control parameters CP1 and CP2 are determined as follows:

$$CP1(new)=CP1(old)+F1*Step1 \quad (1)$$

$$CP2(new)=CP2(old)+F2*Step2 \quad (2)$$

$$\text{Ratio Parameter}=F2:F1=F2/F1 \quad (3)$$

where Step1 is the step size for the first control parameter CP1, Step2 is the step size for the second control parameter CP2, F1 is the change factor for CP1 and F2 is the change factor for CP2. The ratio parameter is the ratio of the factors F2 and F1 and represents the number of steps of change in CP2 for each step of change in CP1. For example, for a ratio parameter of 1, or 1:1, one step of change is applied to CP1 and one step of change is applied to CP2. For a ratio parameter of 2, or 2:1, two steps of change are applied to CP2 and one step of change is applied to CP1. The units of measure for the control parameters CP1 and CP2 are likely to be different because they relate to different characteristics of the signal, such as bandwidth (normally measured in Hz) and dynamic range (normally measured in dB). The step sizes are set by the user for the corresponding control parameter. For example, CP1 can be the sample rate control parameter, measured in units of Hz, and CP2 can the dynamic range control parameter, measured in units of dB. The user can set corresponding step sizes that are appropriate for the signal being compressed. The user also sets the ratio parameter which allows control of relative changes in the control parameters. Through the ratio parameter, the user can control the degree of change in one signal characteristic relative to another signal characteristic.

For a constant ratio parameter, the control function represents a linear function where the ratio parameter determines the slope. FIG. 5 gives examples of control functions for different ratio parameters. The horizontal axis 510 represents the sample rate (SR) of the signal samples. The maximum sample rate is the input sample rate and the minimum sample rate is the Nyquist frequency of the input signal samples or a different minimum sample rate set by the user. It is well known in the art that sampling below the Nyquist frequency causes the undesirable effect of aliasing, so any minimum sample rate set by the user must be greater than the Nyquist frequency. If the user selects a minimum sample rate that would violate the Nyquist frequency, lowpass filtering prior to resampling can be performed prior to the resampler 310. The scale of the horizontal axis 510 corresponds to the step size for changes in sample rate (i.e. Step1). The vertical axis 520 represents the dynamic range (DR) of the signal samples. The maximum dynamic range is the input signal's dynamic range and the minimum dynamic range is set by the user. The minimum dynamic range is one that produces a minimum acceptable quality. The scale of the vertical axis 520 is set by the step size for changes in the dynamic range (i.e. Step2).

The first control function 530 corresponds to a ratio parameter that is less than one, meaning that for every step of change in dynamic range, there are more than one steps of change in sample rate. The control function 530 is linear with a slope equal to the ratio parameter until it reaches the Nyquist frequency. At this point, the sample rate control parameter 312 would be fixed at the Nyquist frequency so that there are no further reductions in sample rate by the resampler 310. Any further reduction in bit rate would occur by reducing dynamic range further by the dynamic range adjuster 320 and/or increasing compression by the encoder 330. The second control function 540 corresponds to a ratio parameter that is greater than one, meaning that for every step of change in sample rate, there are more than one steps of change in dynamic range. The second control function 540 is linear until it reaches the minimum dynamic range. At this point, there are no further reductions in dynamic range by dynamic range adjuster 320. Any further reduction in bit rate would occur by reducing the sample rate by resampler 310 and/or increasing compression by the encoder 330. A pair of change factors (F1, F2) corresponds to a point along the control function graph. For example, the original sample rate and dynamic range correspond to $F1_0=0$ and $F2_0=0$, respectively, and the point 560. Change factors $F1_1$ and $F2_1$ correspond to sample rate control parameter $CP1_1$ and dynamic range control parameter $CP2_1$, respectively, and point 570 along the second control function 540. In this example, change factors $F1_1$ and $F2_1$ are negative.

The control function can be a continuous function defined by the user. The control functions 530 and 540 are piecewise linear. Smooth control functions such as the third control function 535 and the fourth control function 545 can also be defined. These can be represented in a lookup table in memory that includes a column of entries for each control parameter. The ratio parameter is not constant for control functions 535 and 545. For a non-constant ratio parameter, F1 and F2 are related by a nonlinear function as follows, $$F2=f_{RP}(F1) \quad (5a)$$

where the function $f_{RP}$ represents the changing ratio parameter. The control function processor 260 can represent the control function based on a changing ratio parameter in a lookup table in memory that includes entries for the ratio parameter, F1 and F2.

Figures 5A, 5B:
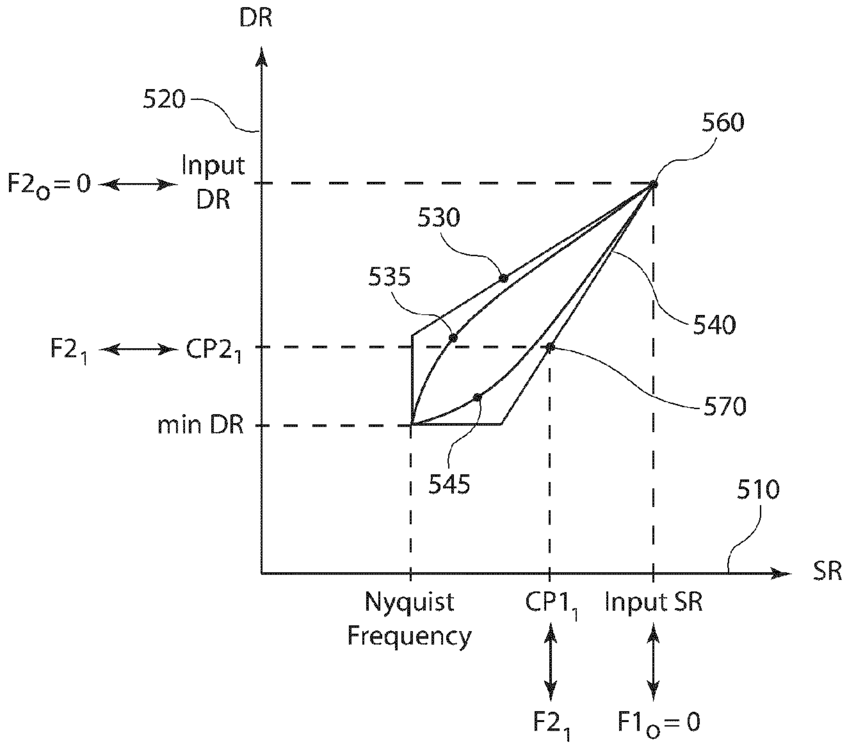
FIG. 5 gives examples of the control functions for two different ratio parameters, in accordance with a preferred embodiment.

The example of FIG. 5*a* shows control functions that coordinate changes in sample rate and dynamic range. However, coordinated control can be applied to other signal characteristics that are affected by compression operations. For example, let the compression control parameter indicate the desired bit rate or compression ratio of the compressed data at encoder output. The compression control parameter can be based on any user-specified figure of merit that is a function of the output bit rate, including output SNR, bit error rate (BER), error vector magnitude (EVM), rise time, fall time or jitter specification. A control function can be defined to provide coordinated control to the compression control parameter and the sample rate control parameter or the compression control parameter and the dynamic range control parameter.

In an alternative embodiment, the control function processor 260 can modify more than two control parameters in accordance with a multidimensional control function to achieve the desired types of distortion. The multidimensional control function can be defined by entries in one or more lookup tables. For example, a control function for three control parameters can be represented by a lookup table with a column of entries for each of the control parameters. Alternatively, the control function can be represented by a mathematical relationship. For example, for three control parameters, ratios A:B:C indicating relative changes among the control parameters can be defined by the user.

In another alternative embodiment, the control function is represented by a user-defined functional relationship between the selected control parameters. The control function can be represented mathematically as a predefined function $f_{CP}$ where, $$CP2=f_{CP}(CP1) \quad (5b)$$

The control function $f_{CP}$ for CP1 and CP2 can be represented by a mathematical formula or a lookup table in memory. FIG. 5*b* gives two examples of lookup tables that define relationships between control parameters CP1 and CP2 that correspond to the control function. Each lookup table 580*a* or *b* includes three columns: an index or address column 581*a* or *b*, a column of entries 584*a* or *b* for the first selected control parameter CP1, and column of entries 586*a* orb for the second selected control parameter CP2. The lookup tables can contain any number of rows depending on how the user defines the control function. For example, lookup table 580*a* has 256 rows and lookup table 580*b* has 512 entries. Current values of CP1 and CP2 are specified by a row pointer or address 582*a* or *b*. Row pointer 582*a* or *b* can indicate a different row in response to the difference between the user-specified goal and a measured performance parameter towards this goal, further described below. The values in columns 584*a* or *b* and 586*a* or *b* can represent an arbitrary shape, such as those of smooth curves 535 and 545 in FIG. 5*a*. For the first lookup table 580*a*, the first three entries of column 586*a* contain the same values (1.0), which allow users to specify a limiting value such as the flat horizontal region of curve 540 in FIG. 5*a*. In the second table 580*b*, the first four example entries in column 584*b* {1.00, 1.04, 1.00, 1.03} are not monotonic, i.e. they are not continuously decreasing or increasing across the range. These examples demonstrate that any user-defined control function can be represented in the column entries of a lookup table. In each of these examples, the lookup tables 580*a* and 580*b* define a relationship between the sample rate control parameter, CP1, and dynamic range control parameter, CP2. The resampler 310 resamples the input signal samples 100 or 211 with a reduced sample rate equal to the input sample rate divided by CP1. The dynamic range control parameter, CP2, represents an attenuation factor such that the dynamic range adjuster 320 multiplies the signal samples 311 by CP2. Note that these alternative representations for CP1 and CP2 are different than those described with respect to equations (1), (2) and (3). As a numerical example, row pointer 582*a* a selects row 3 of lookup table 580*a* in which the value of CP1 is 1.04 and the value of CP2 is 1.00. The resampler 310 will resample the signal samples with the sample rate divided by 1.04. The dynamic range adjuster 320 will simply pass the samples with no change in amplitude since CP2 equals 1.0. The lookup table method can include more than two columns of control parameters for multidimensional control functions.

Figure 6:
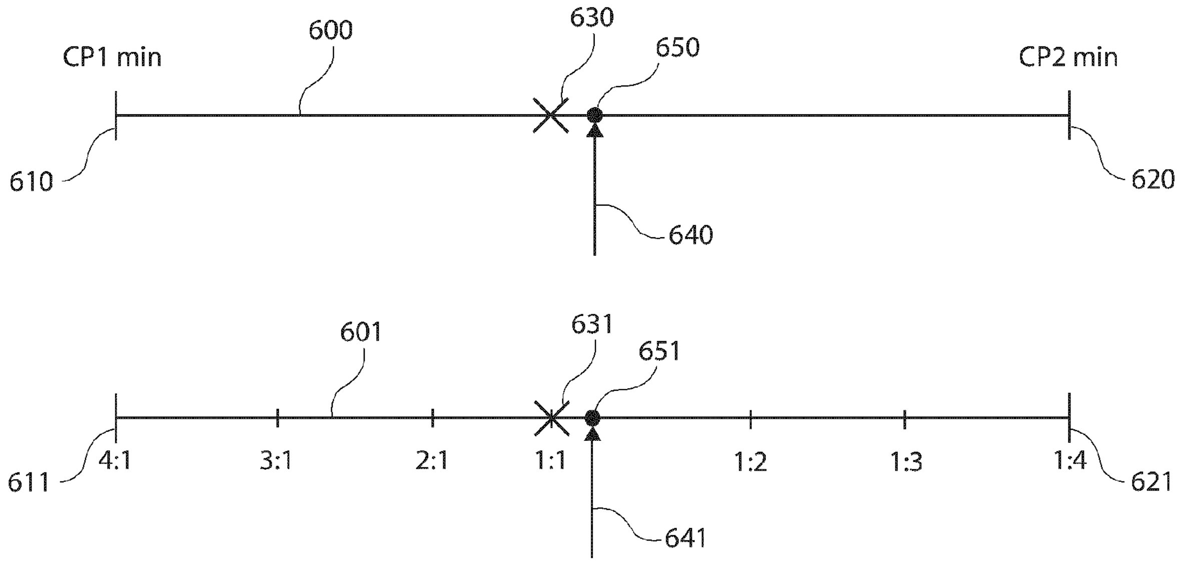
FIG. 6 gives examples of a scale feature for a GUI, in accordance with a preferred embodiment.

The user configures the coordinated control by selecting the control parameters, the control function, the ratio parameter and other processing parameters via the user interface 280. In a preferred embodiment, the user interface 280 includes a GUI with graphical features that are relevant for coordinated control. The user selects the control function and/or the ratio parameter that coordinate the control of the selected control parameters. For ratio parameter selection, the GUI includes a scale that represents a range of ratio parameters available for the selected control parameters. FIG. 6 gives an example of a scale for the GUI. The scale 600 is represented by a line segment having endpoints 610 and 620. The endpoint 610 represents a ratio parameter that produces minimum change in the first control parameter CP1. The endpoint 620 represents a ratio parameter that produces a minimum change in control parameter CP2. The ratio parameter is represented as the ratio of change factors F2:F1, as indicated in equation (3). The ratio parameter is at the minimum of its range at the endpoint 620 corresponding to a minimum change in CP2. At the endpoint 620, the change factor F2 for control parameter CP2 has its lowest value and the change factor F1 for control parameter CP1 has its highest value. The ratio parameter is at the maximum of its range at endpoint 610 corresponding to a minimum change in CP1. At the endpoint 610, the change factor F1 for control parameter CP1 has its lowest value and the change factor F2 for control parameter CP2 has its highest value. The X location 630 on the scale indicates the ratio parameter value of 1:1. The X location 630 is not necessarily the midpoint of scale 600. For the ratio of 1:1, a step of change in CP2 occurs for every step of change in CP1. For example, if there are four steps of change in CP1, there are four steps of change in CP2. The pointer 640 responds to user input to select a particular ratio parameter corresponding to the point 650 on the scale 600.

The scale 601 provides a numerical example. The endpoint 611 corresponding to a minimum change in the control parameter CP1 represents a ratio parameter of 4:1. The endpoint 621 corresponding to a minimum change in the control parameter CP2 represents a ratio parameter of 1:4. The X location 631 indicates the ratio parameter 1:1. For this example, the minimum ratio parameter is the inverse of the maximum ratio parameter. This is not a requirement. However, when this inverse relationship exists, the 1:1 ratio parameter is located at the midpoint of the scale. When the minimum ratio parameter and maximum ratio parameter are not inverses, the 1:1 ratio may not be located at the midpoint of the scale. The pointer 641 selects the ratio parameter corresponding to the point 651. The change factors F1 and F2 can be whole or fractional numbers.

For nonlinear control functions, such as those represented in FIG. 5 by curves 535 and 545, a ratio parameter can be selected for the approximately linear region of the control function. During operation, as the control parameters CP1 and CP2 approach the nonlinear region of the control function, the control function processor 260 modifies the ratio parameter, F1 and F2 in accordance with the control function. The control function can include thresholds values for CP1 and CP2 that indicate the beginning of the nonlinear region. In the nonlinear region, the control function processor 260 can use a lookup table to determine the ratio parameter and the change factors F1 and F2.

Referring to FIG. 2, an embodiment of the control function processor 260 performs the calculations to adjust the selected control parameters CP1 (261*a*) and CP2 (261*b*) in accordance with the ratio parameter, the corresponding change factors F1 and F2 and the corresponding step sizes Step1 and Step 2. The controller input processor 270 can receive inputs from the user interface 280, the signal parameter measurement module 230 and the compressed data measurement module 250. In response to the inputs 231, 281 and 251, the controller input processor 270 determines whether the selected control parameters CP1 and CP2 should be changed. For example to produce a desired bit rate, the controller input processor 270 provides the desired bit rate to the control function processor 260. The control function processor 260 can calculate the changes in CP1 and CP2 in accordance with the ratio parameter that will produce approximately the desired bit rate. Alternatively, the control function processor 260 can apply a positive or negative step change in accordance with equations (1) and (2), where the signs of F1 and F2 are positive or negative depending on the polarity of the desired change.

For example, let CP1 correspond to the sample rate control parameter 312 and CP2 correspond to the dynamic range control parameter 322. The control function processor 260 adjusts the control parameters CP1 and CP2 such that the resampler 310 and dynamic range adjuster 320 produce a change from the current bit rate to the desired bit rate for the modified signal samples 321. Referring to equation (1), changing CP1 by the amount F1*Step1 changes the sample rate by x samples/second. Referring to equation (2), changing CP2 by F2*Step2 changes the number of bits to represent each sample by y bits/sample. The change in bit rate is related to the changes in the control parameters by the product of x and y as follows:

$$\text{bit rate change}=z\text{ bits/second}=x\text{ samples/second}*y\text{ bits/sample} \quad (6)$$

The control function processor 260 can determine the number of steps N required to reach the desired bit rate change as follows:

$$N=\text{desired bit rate change}/z \quad (7)$$

The number of steps N can be a whole or fractional number. The change factors F1 and F2 can be multiplied by N so that CP1 and CP2 are updated as follows:

$$\text{CP1(new)}=\text{CP1(old)}+N*F1*\text{Step1} \quad (8)$$

$$\text{CP2(new)}=\text{CP2(old)}+N*F2*\text{Step2} \quad (9)$$

The ratio parameter is the same, since $$\text{Ratio Parameter}=F2/F1=N*F2/N*F1 \quad (10)$$

For this example, the bit rate change was calculated exactly using equation (6). In one alternative, approximations of the bit rate change and the number of steps N can be used to update the control parameters CP1 and CP2. In another alternative, the control function processor 260 can apply a positive or negative step change in accordance with equations (1) and (2), where the signs of F1 and F2 correspond to the polarity of the desired bit rate change.

Referring again to FIG. 2, the compressed data measurement module 250 provides measurements that are useful for feedback control of the preprocessor 210 and the signal compression processor 220. To provide feedback control, the controller 240 calculates adjustments to one or more of the control parameters 261*a*, 261*b* and 271 based on the feedback parameters received from input 251. In particular, the controller 240 can provide coordinated control of selected control parameters 261*a* and 261*b* in response to feedback parameters. In an embodiment for feedback control, the controller input processor 270 calculates the difference between a feedback parameter and a corresponding desired value and provides the resulting error value to the control function processor 260. The control function processor 260 calculates corresponding changes for the selected control parameters CP1 and CP2 based on the error value. Any changes to the selected control parameters CP1 and CP2 are determined in accordance with the control function or the ratio parameter. In the above example for the sample rate control parameter 312 and the dynamic range control parameter 322, the controller input processor 270 determines a bit rate error value by calculating the difference between the measured bit rate provided as a feedback parameter and the desired bit rate. The control function processor 260 calculates the control parameters CP1 and CP2 using equations (6) through (9) where the bit rate change in equation (6) is the negative of the bit rate error value. Alternatively, the control function processor 260 can apply step changes in accordance with equations (1) and (2), as described above. In an embodiment where the control function is represented by a lookup table, as previously described with respect to FIG. 5*b*, the control function processor 260 determines the pointer 582*a* or 582*b* based on the bit rate error value. Each set of values for control parameters CP1 and CP2 corresponding to each row in the lookup table has an associated bit rate change that can be calculated using methods well known in the art. The control function processor 260 can use the bit rate error value to select the appropriate bit rate change and the associated set of values for control parameters CP1 and CP2.

Figure 7:
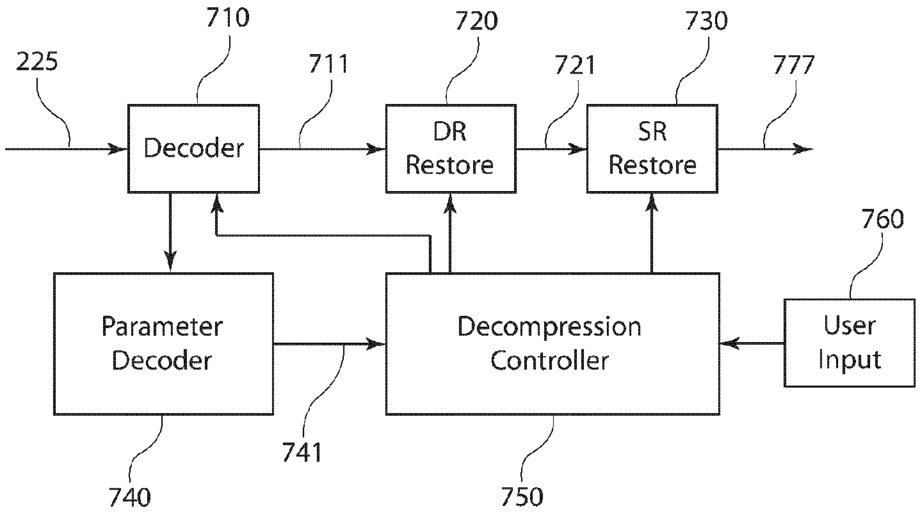
FIG. 7 is a block diagram of a decompressor that forms reconstructed signal samples from the compressed samples, in accordance with a preferred embodiment.

A control parameter used by the signal compression processor 220 may also be needed for decompression. The encoder 330 can encode one or more control parameters and include encoded control parameters with the compressed samples 225. FIG. 7 is a block diagram of a decompressor that forms reconstructed signal samples 777 from the compressed samples 225. The decoder 710 performs inverse operations of the encoder 330 to produce decoded samples 711. As described previously with respect to FIG. 3, the encoder 330 may calculate first or higher order derivatives of the modified signal samples 321 and/or Huffman or other encoding to form compressed samples 225. The decoder 710 applies Huffman or other decoding to the compressed samples 225 to form decoded samples 711. Alternatively, if the encoder 330 calculated first or higher order derivatives prior to Huffman or other encoding, the Huffman or other decoding produces decoded derivative samples. The decoder 710 applies an integrator to the decoded derivative samples to form the decoded samples 711. The integrator provides an inverse operation to the first or higher order derivative calculation. If the encoder 330 applied lossless encoding, the decoded samples 711 would be identical to the modified signal samples 321. If lossy encoding was applied, the decoded samples 711 would be approximately the same as the modified signal samples 321. If control parameters were encoded, the decoder 710 separates the encoded parameters for decoding by the parameter decoder 740. The decompression controller 750 receives the decoded control parameters 741 and user input 760 to determine decompression control parameters for the decoder 710, the dynamic range restore module 720 and the sample rate restore module 730. The dynamic range restore module 720 applies multiplication and/or left-shifting operations to increase the amplitudes of the decoded samples to the original dynamic range. The decompression controller 750 uses the decoded dynamic range control parameter to determine one or more factors for the multiplication and/or left-shifting operations. Since the dynamic range adjuster 320 reduced the number of bits for representing the resampled signal samples 311, the scaled samples 721 will be approximations of the resampled signal samples 311. The sample rate restore module 730 resamples the scaled samples 721 at the original sample rate. A Farrow filter can be used for the resampling operation as described previously for the resampler 310. The samples output from the sample rate restore module 730 are reconstructed signal samples 777. As stated previously for the signal compression processor 220, the order of the dynamic range restore module and the sample rate restore module can be reversed. Since the operations of the signal compression processor 220 are lossy, the reconstructed signal samples 777 are approximations of the original signal samples 100.

Figure 8:
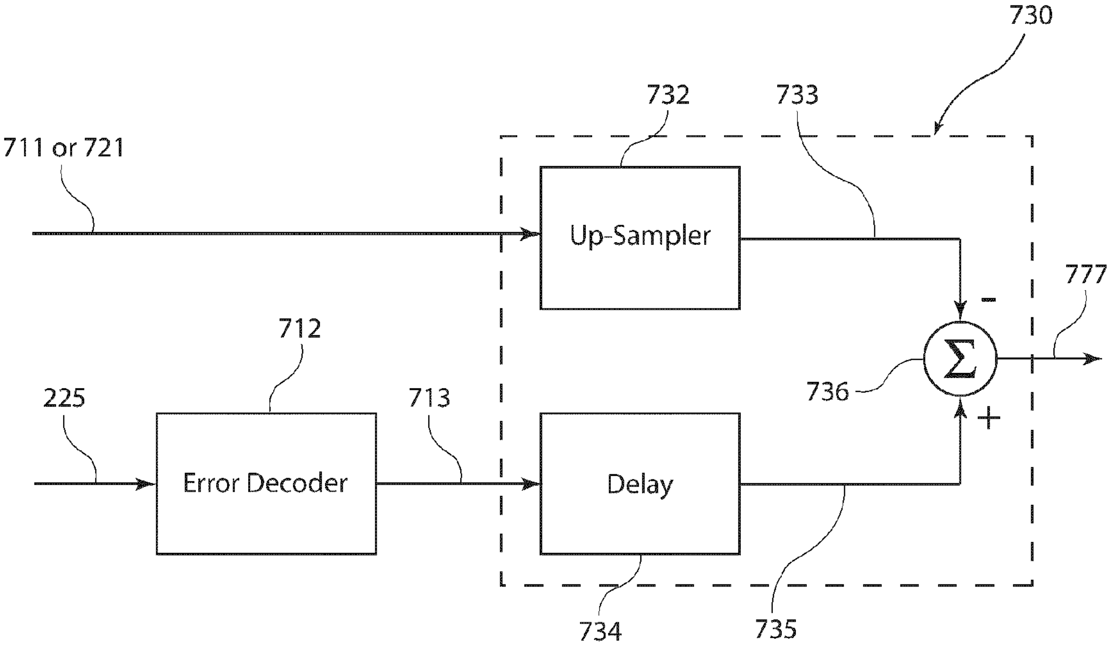
FIG. 8 is a block diagram of the sample rate restore module that corrects resampling errors, in accordance with a preferred embodiment.

FIG. 8 is a block diagram of an embodiment of the sample rate restore module 730 that corrects resampling errors. This corresponds to the embodiment of the compressor's resampler 310 where the resampling error 451 is calculated, as described with respect to FIG. 4. The error decoder 712 decodes the encoded error samples included in the compressed samples 225 to produce decoded error samples 713. The decoded error samples 713 have the original sample rate and correspond to the error samples 451 in FIG. 4. The decoder 710 can include the error decoder 712. The upsampler 732 resamples the decoded samples 711 or the scaled samples 721, depending on the order of these operations in the signal compression processor 220. FIG. 8's decoded samples 711 or scaled samples 721 correspond to resampled (downsampled) signal samples 311 in FIG. 4. The upsampler output samples 733 have the original sample rate. The delay buffer 734 delays the decoded error samples so that they have the correct temporal alignment with the upsampler output samples 733, thus compensating for processing delays in the upsampler 732. The adder 736 adds each upsampler output sample 733 with the corresponding decoded error sample 735 to produce the reconstructed signal samples 777.

In alternative embodiments for the compressor, an optional preprocessor 210 is included to perform filtering, downconversion and other operations to prepare the input signal samples 100 for compression. The preprocessor 210 produces signal samples 211 with lowpass characteristics that can be effectively compressed by the signal compression processor 220. Depending on the characteristics of the input signal 100, the preprocessor 210 may selectively reorder and selectively invert signal samples 100 to form one or more streams of signal samples. The signal compression processor 220 performs the selected compression operations in accordance with the control parameters on each signal stream. The preprocessor 210 receives control parameters 212 from the controller input processor 270.

Figure 9:
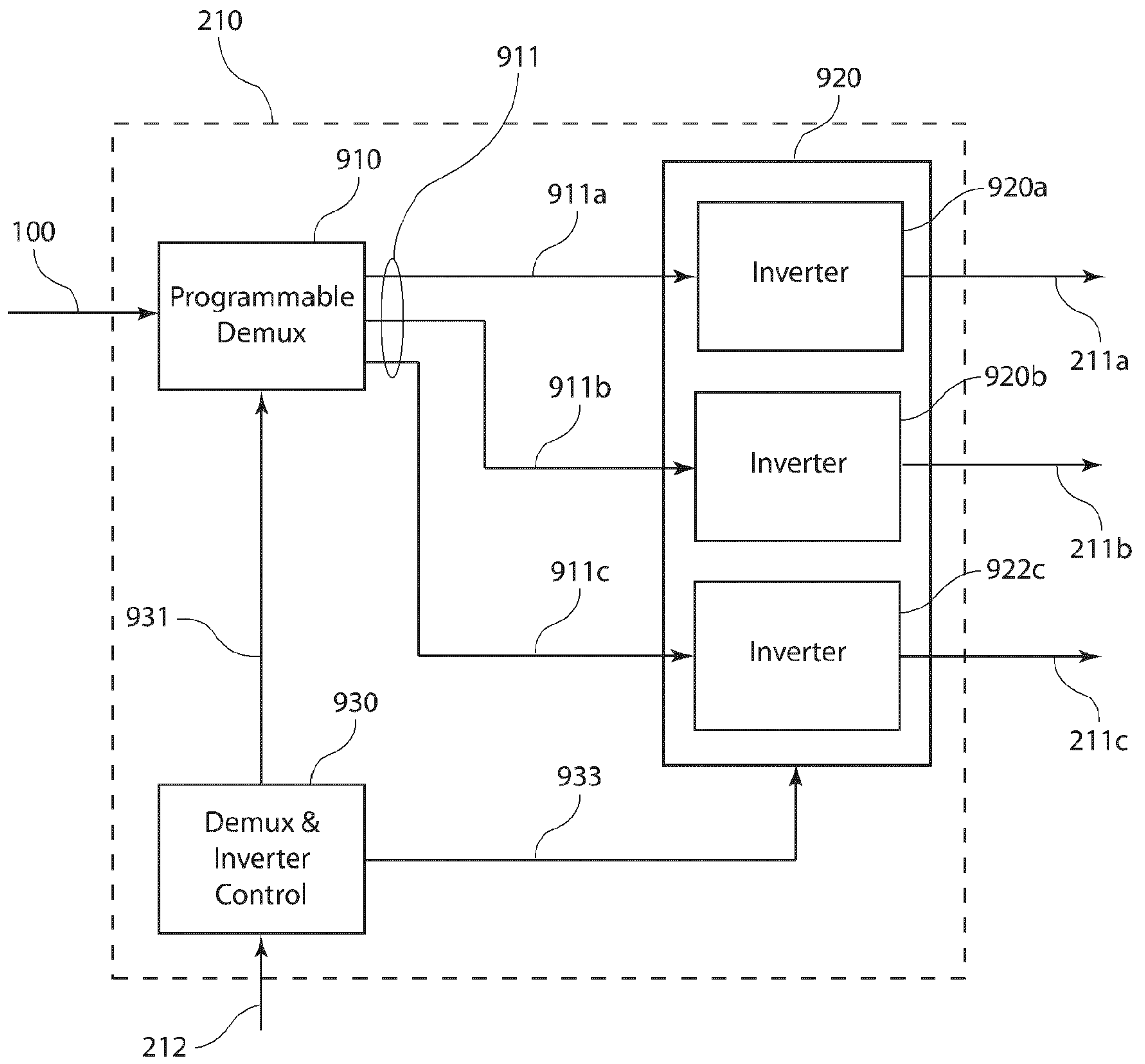
Figure 9 Prior Art
FIG. 9 is a block diagram of the preprocessor, in accordance with the prior art.

FIG. 9 is a block diagram of the preprocessor 210. (The '533 patent also describes the preprocessor operations with respect to FIG. 12.) The programmable demultiplexer 910 reorders the signal samples 100 into one, two or three demultiplexed signal sample streams 911*a*, 911*b* and 911*c* in accordance with a reordering control parameter 931. A programmable inverter 920*a*, 920*b* and 920*c* for each demultiplexed signal sample stream 911*a*, 911*b* and 911*c* selectively inverts signal samples in accordance with the inversion control parameter 933. Each inverter output 211*a*, 211*b* and 211*c* provides a set of demultiplexed input samples for the signal compression processor 220. The signal compression processor 220 applies the selected operations of resampling, dynamic range adjustment and encoding to each set of demultiplexed input samples 211*a*, 211*b* and 211*c* to form compressed samples 225. Referring to FIG. 3, the resampler 310 and dynamic range adjuster 320 can form up to three sets of modified signal samples 321. The encoder 330 applies first or higher order differences to each set of modified signal samples 321 and/or Huffman or other encoding to form compressed samples 225.

Figure 10:
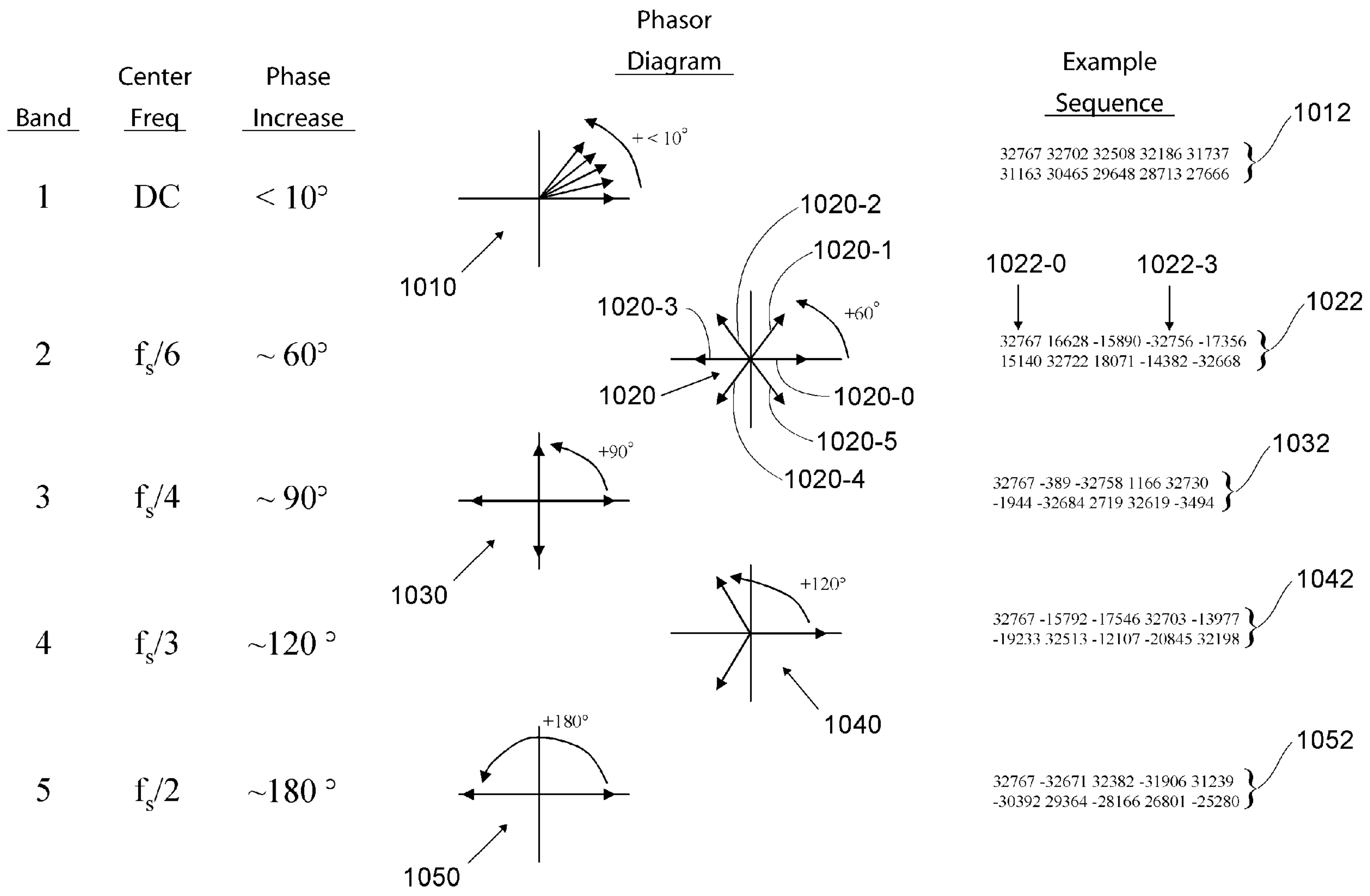
Figure 10 Prior Art
FIG. 10 gives examples of signal samples and phasor diagrams to illustrate the operations of the programmable demultiplexer and the programmable inverter, in accordance with the prior art.

FIG. 10 gives examples of signal samples and phasor diagrams to illustrate the operations of the programmable demultiplexer 910 and the programmable inverters 920. Beginning with the example of a baseband signal, corresponding to row labeled "Band 1" in FIG. 10, the center frequency is near DC (0 Hz) and the phase increase between consecutive samples is less than 10 degrees. The first phasor diagram 1010 shows that since the phase changes between consecutive samples are small, the magnitudes of the differences of consecutive samples will be relatively small compared to the magnitudes of the samples themselves. The first example sequence 1012 corresponds to samples of a baseband signal in Band 1. Since the differences between consecutive samples are small relative to the sample magnitudes, calculating first or higher order derivatives, or differences, creates derivative samples with smaller data widths than the original samples. Compression using this approach is effective for the baseband (Band 1) example in FIG. 3.

FIG. 10 also gives examples of sampled signals where the center frequency is above DC, but below the Nyquist frequency, $f_s/2$. For Band 2, the center frequency is near $f_s/6$ and the phase increase between consecutive samples is about 60 degrees. The second phasor diagram 320 shows that pairs of samples separated by 180 degrees, or three sampling intervals, have similar magnitudes but opposite polarities, as illustrated by pairs of samples (1020-0, 1020-3), (1020-1, 1020-4) and (1020-2, 1020-5). Inverting one of the samples in the pair (or multiplying by −1) provides a close estimate of the other sample in the pair. The second example sequence 1022 also shows that samples separated by three sampling intervals have similar magnitudes and opposite signs. For example, the value of sample 1022-0 is 32767 and the value of sample 1022-3 is −32756. For Band 2, derivative after selective inversion operations on samples separated by three sampling intervals produce derivative samples with smaller data widths. The smaller data width allows a greater amount of compression.

For the example of Band 3 in FIG. 10, the center frequency is near $f_s/4$ and the phase increase between consecutive samples is about 90 degrees. The third phasor diagram 1030 shows that samples separated by 180 degrees, or 2 sampling intervals, have similar magnitude and opposite polarity. The third example sequence 1032 also shows that every other sample has similar magnitudes and opposite polarities. For Band 3, inverting samples separated by two sampling intervals followed by computing their difference will result in derivative samples with smaller data widths that can be encoded more efficiently than the original samples.

For the example of Band 4 in FIG. 10, the center frequency is near $f_s/3$ and the phase increase between consecutive samples is about 120 degrees. The fourth phasor diagram 1040 shows that samples separated by 360 degrees, or 3 sampling intervals, will have similar magnitudes. The fourth example sequence 1042 shows that every third sample has similar magnitudes. In this case, forming a difference between samples separated by 3 sampling intervals will give a derivative sample with a smaller data width that can be encoded more efficiently than the original samples.

For the example of Band 5 in FIG. 10, the center frequency is $f_s/2$ and the phase increase between consecutive samples is about 180 degrees. The fifth phasor diagram 1050 shows that samples separated by 180 degrees, or one sampling interval, will have similar magnitudes but opposite polarities. The fifth example sequence 1052 shows consecutive samples have similar magnitudes and opposite polarities. In this case, inverting every other sample and calculating a difference will form a modified sample with a smaller data width that can be encoded more efficiently than the original samples.

The above examples described for FIG. 10 show that data compression can be achieved by performing operations such as inversion followed by subtraction (or addition) or subtraction on signal samples that are separated by 1, 2 or 3 sampling intervals, depending on the ratio of the sample rate to the center frequency. The resulting derivative samples are then encoded to form compressed samples. Similar operations can be applied to samples that are separated by four or more sampling intervals, depending on the ratio of the center frequency to the sample rate, to produce difference samples with smaller data widths than the original signal samples.

FIG. 11 shows the operations that the programmable demultiplexer 910 and programmable inverter 920 perform based on the center frequency of the signal samples 100. The first column 1100 gives the possible center frequencies for this example. The second column 1120 gives a corresponding frequency band indicator for each center frequency. The indicators can be used as parameters for the reordering control parameter 931 and the inversion control parameter 933. The third column 1130 gives the different separations between samples x(i) and x(i−j) at demultiplexer outputs 911*a*, 911*b* and 911*c* that would be produced as a result of reordering control parameter 931. The fourth column 1140 shows the result of inversion under control by inversion control parameter 933. When the inverter 920 is "on" the delayed sample x(i−j) is inverted. The fifth column 1150 shows the mathematical results if derivatives y(i) are calculated by the encoder 330. The derivative samples are functions ƒ[ ] of the demultiplexed input samples x, where the function ƒ[ ] is determined by the selected operations of the resampler 310 and the dynamic range adjuster 320. If resampling operations are performed, the calculation operations for y(i) are selected in accordance with the sample intervals of the resampled signal streams.

Figure 12:
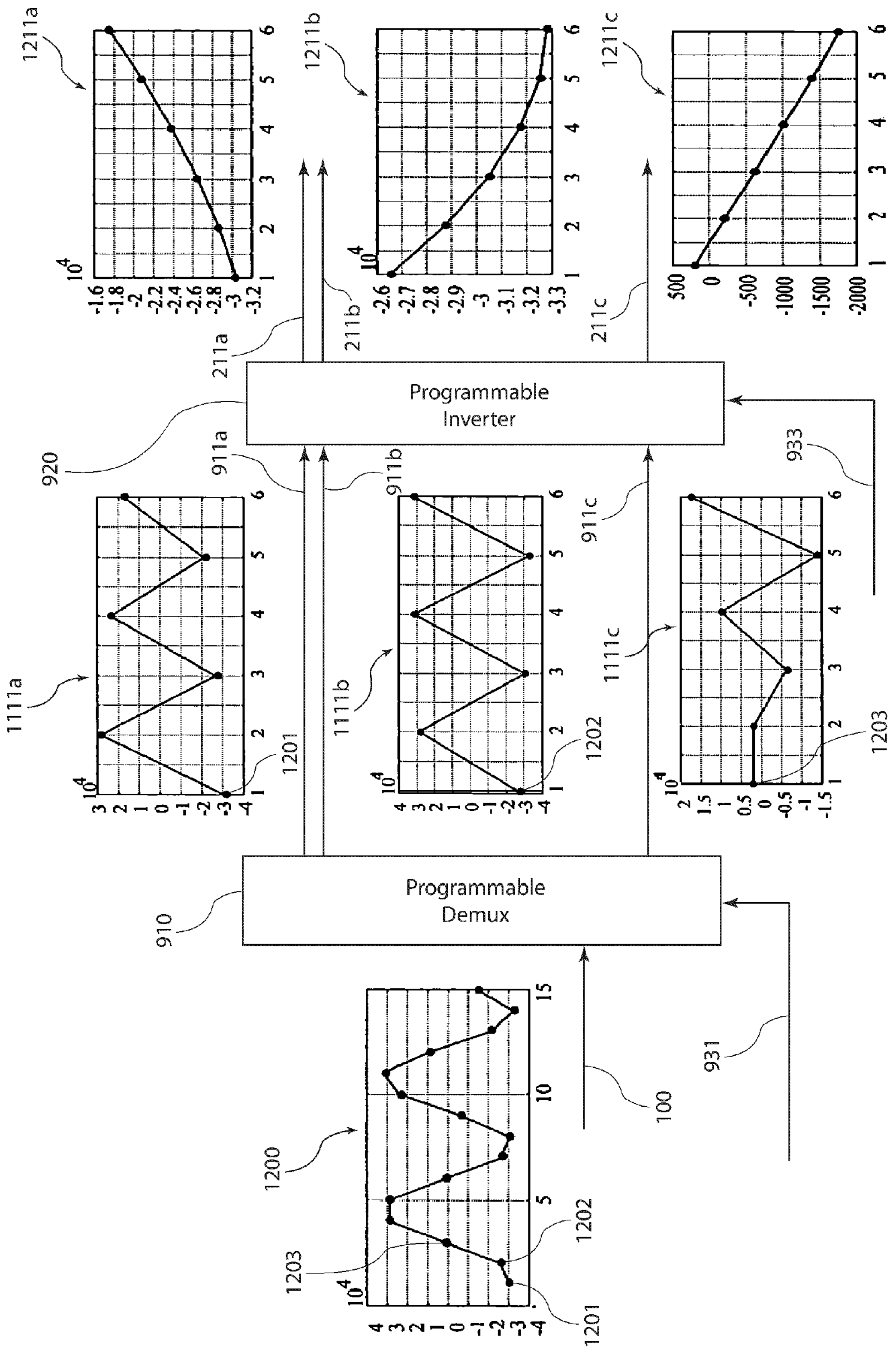
Figure 12 Prior Art
FIG. 12 gives an example of the results of operations on signal samples input to the programmable demultiplexer and the programmable inverter, in accordance with the prior art.

FIG. 12 gives an example of the results of operations on signal samples 100 input to the programmable demultiplexer 910 and the programmable inverter 920. The graph 1200 shows signal samples 100 with a center frequency of $f_s/6$. For this example, the programmable demultiplexer 910 reorders the signal samples 100 into three sets 911*a*, 911*b* and 911*c*, each having samples separated by three sampling intervals. The graphs 1111*a*, 1111*b* and 1111*c* show every third sample starting with the first sample 1201, the second sample 1202 and the third sample 1203, respectively. The programmable inverter 920 for each demultiplexed sample stream 911*a*, 911*b* and 911*c* inverts every other sample, in accordance with the control parameter 933. The graphs 1211*a*, 1211*b* and 1211*c* show the resulting samples. Each stream of inverter output samples forms a corresponding stream of demultiplexed input samples, 211*a*, 211*b* and 211*c*, respectively, for the signal compression processor 220. Referring to FIG. 3, the resampler 310 and dynamic range adjuster 320 may be applied to each stream of demultiplexed input samples, 211*a*, 211*b* and 211*c*, in accordance with their respective control parameters 312 and 322 to form three sets of modified signal samples 321 for the encoder 330. The encoder 330 encodes each set of modified signal samples 321 to form three sets of compressed samples that can be multiplexed together to form compressed samples 225 using techniques known to those skilled in the art. The encoder 330 may apply Huffman encoding or other bit-packing in accordance with the compression control parameter 332, as described previously. Alternatively, encoder may calculate first or higher order derivatives of each set of modified signal samples 321 prior to Huffman encoding.

Figure 13:
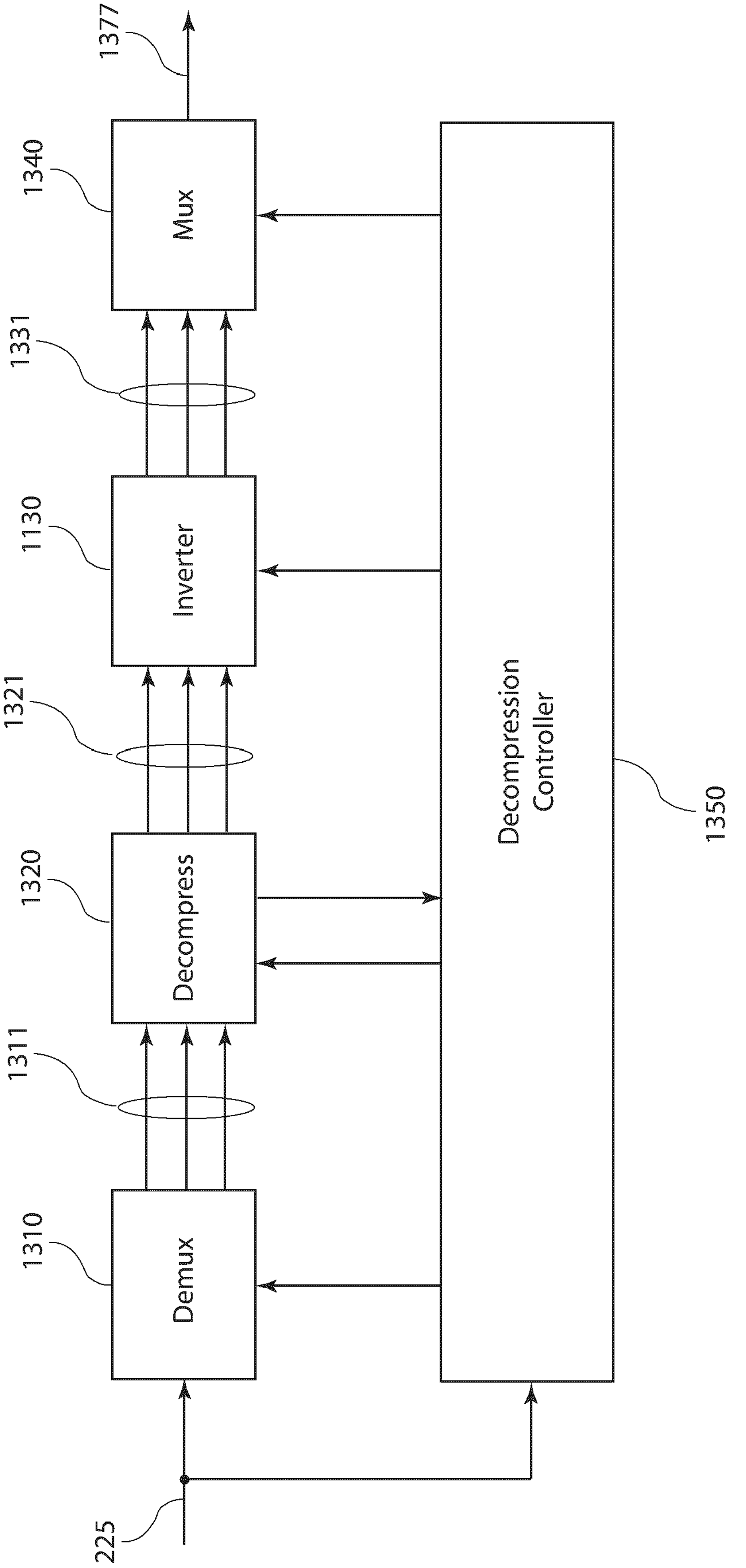
FIG. 13 is a block diagram for decompression that includes inverse operations to the demultiplexing and inverting operations performed by the preprocessor, in accordance with an alternative embodiment.

FIG. 13 is a block diagram for decompression that includes inverse operations to the demultiplexing and inverting operations performed by the preprocessor 210. The demultiplexer 1310 separates the compressed samples 225 into the three sets of compressed samples 1311. The decompressor 1320 decompresses each of the three sets of compressed samples 1311, using the operations described previously with respect to FIG. 7, to form three sets of reconstructed signal samples 1321, each corresponding to a reconstructed version of demultiplexed input samples 211*a*, 211*b* or 211*c*, respectively. Each set of reconstructed signal samples 1321 is input to a programmable inverter 1330 producing reconstructed sample streams 1331 that correspond to the demultiplexed signals 911. The multiplexer 1340 re-orders the reconstructed sample streams to form reconstructed signal samples 777 that correspond to the original signal samples 100. The decompression controller 1350 provides control parameters for the demultiplexer 1310, decompressor 1320, inverter 1330 and the multiplexer 1340. In embodiments where encoded control parameters are included in the compressed samples 225, the decompression controller 1350 recovers the control parameters from the compressed samples 225.

In applications that include analog to digital conversion of an input analog signal, an embodiment of the present invention can be included in a compression subsystem that compresses the signal samples produced by the ADC. Compressing the signal samples output from an ADC reduces the bit rate of the samples. The reduced bit rate has several design advantages, including the following:

1) reducing the data transfer rate requirements of the ADC interface or allowing more rapid data transfer at the same data transfer rate,
2) reducing the number of connections (pins or balls) on an ADC device package,
3) if storage of the samples is required, storage capacity can be reduced or more samples can be stored.

Prior to specific processing for the application, a decompression subsystem decompresses the compressed samples to reconstruct the signal samples for application specific processing. These advantages also apply when a compression subsystem compresses signal samples prior to transferring to a DAC. After transfer of the compressed samples, a decompression subsystem decompresses the compressed samples to produce the reconstructed signal samples. The DAC converts the reconstructed signal samples to an analog signal.

Figure 14:
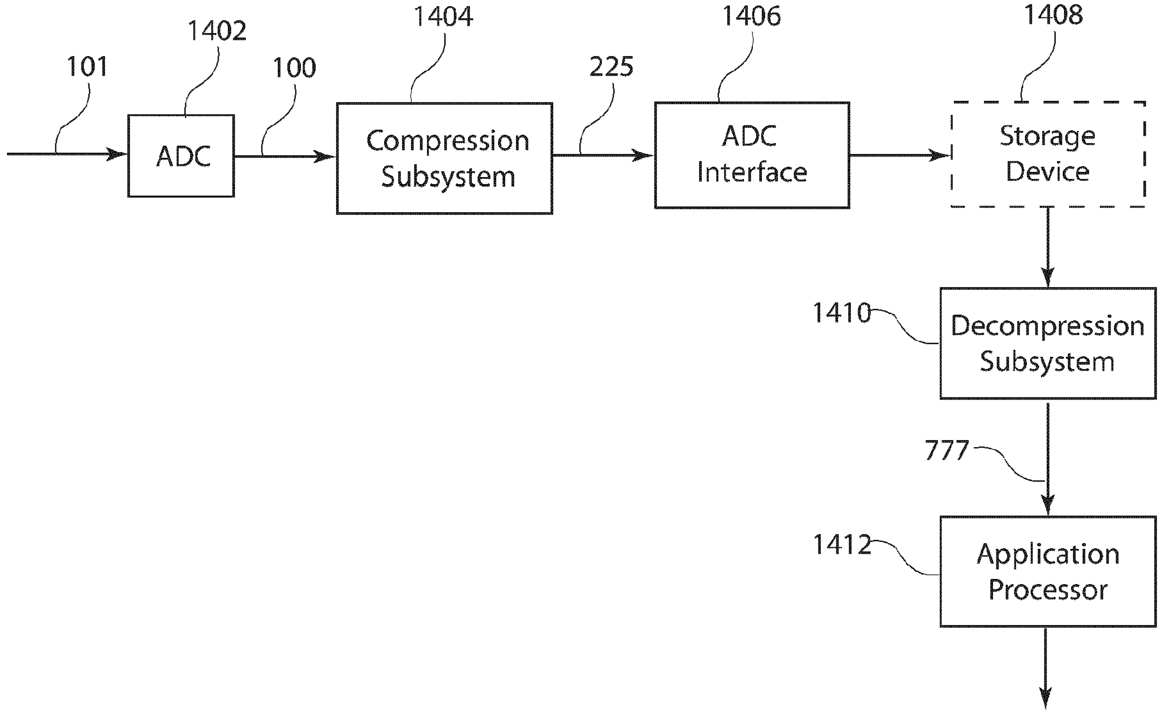
FIG. 14 is a block diagram of an application that compresses the digital signal samples produced by an ADC, in accordance with an alternative embodiment.

FIG. 14 is a block diagram of an application that compresses the digital samples produced by an ADC. The ADC 1402 converts an input analog signal 101 to signal samples 100 that are input to the compression subsystem 1404. The compression subsystem 1404 includes at least the signal compression processor 220 (see FIG. 2) to produce compressed samples 225. Alternative embodiments of the compression subsystem 1402 can include additional elements shown in FIG. 2 depending on the requirements of the application. The compression subsystem 1404 would further include the controller 240 when the application requires determining the control parameters 261*a*, 261*b* and 271. The compression subsystem 1404 would further include the compressed data measurement module 250 when feedback control of the signal compression processor 220 is required. The compression subsystem 1404 would further include the preprocessor 210 if the characteristics of the signal samples 100 in the application require the preprocessing operations previously described. The compression subsystem 1404 would further include the signal parameter measurement module 230 when needed by the controller 240 for determining any of the control parameters. The compression subsystem 1404 would further include the user interface 280 if user input is needed for developing, configuring or initializing the system. The compression subsystem 1404 produces compressed samples 225 for the ADC interface 1406. Depending on the application, the ADC interface can provide the compressed samples to a storage device 1408, other operations, another interface or directly to the decompression subsystem 1410. The application processor 1412 performs the operations that would normally occur for the application. Prior to application processor 1412, the decompression subsystem 1410 decompresses the compressed signal samples to form reconstructed signal samples 777. Referring to FIG. 7, the decompression subsystem 1410 includes the decoder 710 and at least one of the dynamic range restore module 720 and the sample rate restore module 730 depending on the operations performed by the compression subsystem 1404. The decompression subsystem 1410 can also include one or more additional elements, including the decompression controller 750, the parameter decoder 740 and the user input module 760. When the compression subsystem 1404 includes a preprocessor 210 that performs the demultiplexing and inverting operations described with respect to FIG. 9, the decompression subsystem 1410 would include the elements of FIG. 13 to form the reconstructed signal samples 777. The application processor 1412 performs the operations specific to the application on the reconstructed signal samples 777. The embodiments of compression and decompression include simple operations that can be implemented to operate in real time. Implementations of the compression subsystem 1404 and the decompression subsystem 1410 can operate in real time, or the rate at which the ADC 1402 forms the digital signal samples 100 from the input analog signal 101.

Figure 15:
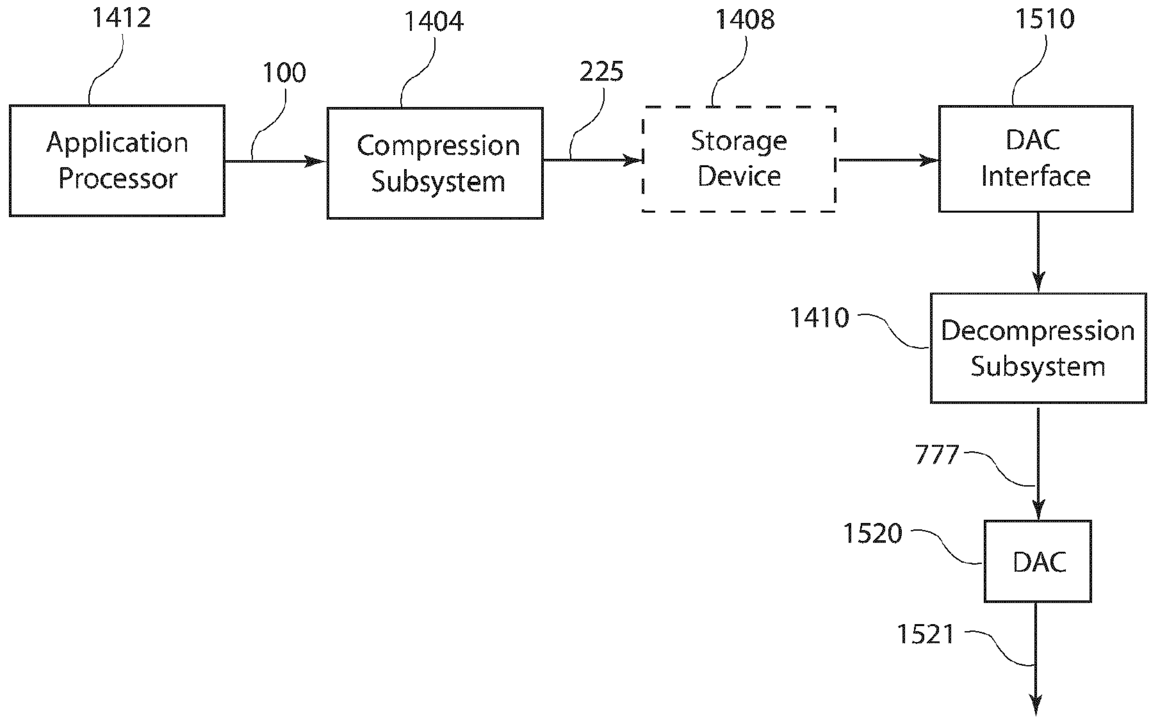
FIG. 15 is a block diagram of an application that compresses signal samples prior to transfer to a DAC, in accordance with an alternative embodiment.

FIG. 15 is a block diagram of an application that compresses signal samples prior to transfer to a DAC. The application processor 1412 produces the signal samples 100. The compression subsystem 1404 compresses the signal samples 100 to form compressed samples 225. The compression subsystem 1404 has alternative embodiments as described above with respect to FIG. 14. Depending on the application, the compressed samples 225 may be transferred to a storage device 1408, other operations, another interface or directly to the DAC interface 1510. The DAC interface 1510 provides the compressed samples to the decompression subsystem 1410. The decompression subsystem 1410 has alternative embodiments as described above with respect to FIG. 14. The decompression subsystem 1410 provides reconstructed signal samples 777 to the DAC 1520. The DAC converts the reconstructed signal samples to an analog output signal 1521. The compression subsystem 1404 and decompression subsystem 1410 can be implemented to operate in real time, or the rate at which the DAC 1520 forms the output analog signal 1521 from the reconstructed signal samples 777.

A data acquisition system can include an embodiment of the present invention. A compression subsystem can be integrated into an application specific integrated circuit (ASIC) that includes an ADC. Alternatively, the compression subsystem can be implemented in a separate device that can be coupled to the output of an ADC chip. The device can include ASIC implementation, a field programmable gate array (FPGA) implementation or a programmable processor, such as a digital signal processor (DSP), microprocessor or microcontroller. Depending on the system architecture, the decompression subsystem may be incorporated in the same device or in a separate device, such as an ASIC, FPGA or programmable processor that may also include the implementation of the application's specific functions.

In an application the where the signal samples are compressed prior to transfer to a DAC, a preferred implementation integrates the compression subsystem into the application's processor using ASIC, FPGA or programmable processor technology. A preferred implementation of the decompression subsystem is an ASIC core in the DAC device.

An embodiment of a GUI for user input to an application can be implemented using programming techniques well known in the art. The GUI can be a permanent part of the application or part of a test system used to configure an embedded application.

Figure 16:
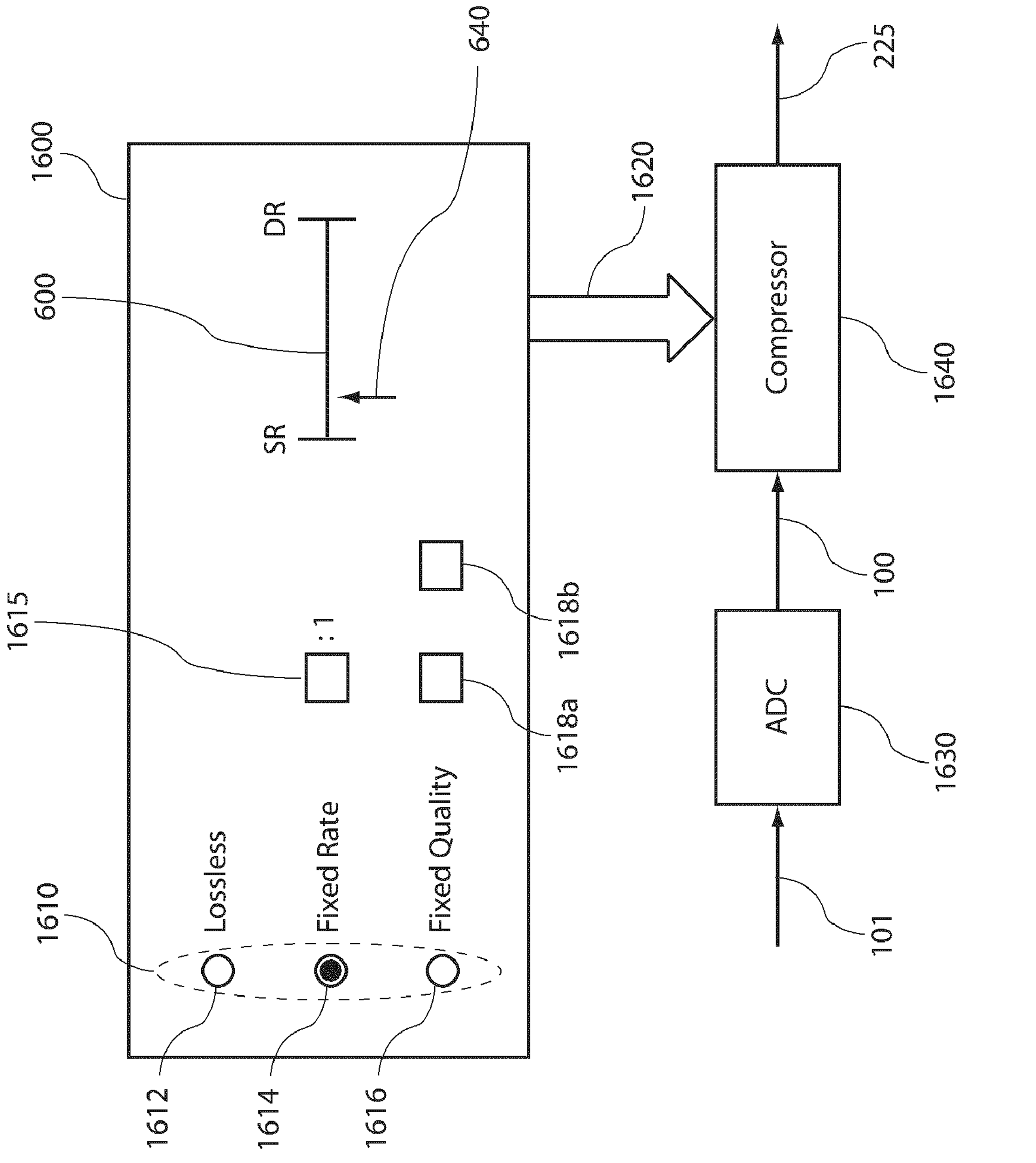
FIG. 16 illustrates a system that includes a GUI connected to a compressor, in accordance with an alternative embodiment.

FIG. 16 illustrates an embodiment of a system that includes a GUI 1600 connected to a compressor 1640. The GUI 1600 is an embodiment of the user interface 280 in FIG. 2. The user selects the desired control and configuration for the compressor 1640 using the graphical constructs of the GUI 1600. In this embodiment, the user can select from three operating modes of the compressor 1640 via compression mode options 1610. The selectable options include a lossess compression mode 1612, a fixed rate compression mode 1614 and a fixed quality compression mode 1616. The black dot next to the "fixed rate" element 1614 indicates that the user has selected the fixed rate compression mode. For fixed rate compression mode 1614, the user specifies the desired compression ratio 1615 by entering a numerical value. For example, an entry of 1.9 indicates a desired fixed compression ratio of 1.9:1. When the user selects the fixed quality mode, the GUI 1600 includes additional input boxes 1618*a,b* for entry of desired quality parameters. Fixed quality parameter options include values for the sample rate and dynamic range as well as quality parameters for corresponding decompressed, or reconstructed, signal samples including signal to noise ratio, noise floor and bit error rate. The scale 600 and pointer 640, previously described with respect to FIG. 6, in this example are used to select a ratio parameter that will be used to coordinate the sample rate (SR) change and dynamic range (DR) change. The GUI 1600 can also provide for the entry of other control parameters, including compression control parameters 332 for control of the encoder 330 in FIG. 3 and preprocessor control parameters 212 for control of the preprocessor 210 in FIG. 2. The GUI 1600 can be implemented in a computer, an embedded microprocessor or a digital signal processor coupled to a display device, or any programmable system having a graphical display.

Input parameters corresponding to the user's selections are transferred via communication channel 1620 to the compressor 1640. The communication channel 1620 can be a parallel or serial cable, a parallel or serial bus, a wireless channel, an optical connection or other data transfer channel. In this embodiment, the compressor 1640 includes the signal compression processor 220, controller 240 and compressed data measurement module 250 and can optionally include the preprocessor 210 and signal parameter measurement module 230 previously described. This embodiment also includes an ADC 1630 that converts an input analog signal 101 to the signal samples 100 input to the compressor 1640. In alternative embodiments, the ADC 1630 and compressor 1640 can be implemented in the same integrated circuit or in a multichip module. A multi-chip module contains two or more semiconductor die in one electronic package.

Incorporating embodiments of the present invention in a system may increase the gate count and power consumption. However, the benefits of compression will decrease other system costs, such as the cost of storage to capture the compressed samples or the cost of a bus or network to transfer the compressed samples to decompressor.

While the preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A method for compressing a sampled input signal having a plurality of signal samples with a dynamic range and a sample rate, comprising:

setting a characteristic of a control function in memory;

applying the control function to determine a sample rate control parameter and a compression control parameter in accordance with the characteristic of the control function;

downsampling the signal samples in accordance with the sample rate control parameter to form downsampled signal samples having a reduced sample rate;

upsampling the downsampled signal samples to form upsampled signal samples having the sample rate, wherein the upsampled signal samples are approximations of corresponding signal samples in the plurality of signal samples;

subtracting the upsampled signal samples from the corresponding signal samples to form error samples;

encoding the downsampled signal samples in accordance with the compression control parameter to form encoded downsampled signal samples; and encoding the error samples in accordance with the compression control parameter to form encoded error samples, wherein the encoded downsampled signal samples and the encoded error samples form a plurality of compressed samples.

2. The method of claim 1, wherein the step of downsampling applies a downsampling Farrow filter to the signal samples to form the downsampled signal samples and the step of upsampling applies an upsampling Farrow filter to the downsampled signal samples to form the upsampled signal samples.

3. The method of claim 1, wherein the step of downsampling applies a downsampling polyphase filter to the signal samples to form the downsampled signal samples and the step of upsampling applies an upsampling polyphase filter to the downsampled signal samples to form the upsampled signal samples.

4. The method of claim 1, further comprising one of the following steps performed in accordance with a dynamic range control parameter:

adjusting the dynamic range of the downsampled signal samples in accordance with the dynamic range control parameter to form modified signal samples prior to the step of encoding, wherein the encoding is applied to the modified signal samples to form the encoded downsampled signal samples; and adjusting the dynamic range of the signal samples in accordance with the dynamic range control parameter to form adjusted signal samples prior to the step of downsampling, wherein the downsampling is applied to the adjusted signal samples to form the downsampled signal samples.

5. The method of claim 4, further comprising the step of:

applying the control function to determine the dynamic range control parameter.

6. The method of claim 4, further comprising:

encoding the dynamic range control parameter to form an encoded dynamic range control parameter, wherein the compressed samples include the encoded dynamic range control parameter.

7. The method of claim 1, further comprising:

encoding the sample rate control parameter and the compression control parameter to form encoded control parameters, wherein the compressed samples include the encoded control parameters.

8. The method of claim 1, further comprising:

measuring a characteristic of the compressed samples to form a feedback parameter; and modifying at least one of the sample rate control parameter and the compression control parameter in accordance with the feedback parameter, wherein the sample rate control parameter and the compression control parameter are modified in accordance with the control function.

9. The method of claim 1, wherein the step of downsampling the signal samples applies non-uniform sampling to form the downsampled signal samples having non-uniform sample intervals, wherein the reduced sample rate is an average sample rate for the downsampled signal samples.

10. The method of claim 1, wherein the step of encoding the downsampled signal samples further comprises:

applying Huffman encoding to the downsampled signal samples to form the encoded downsampled signal samples.

11. The method of claim 1, wherein the step of encoding the downsampled signal samples further comprises:

calculating first or higher order derivatives of the downsampled signal samples to produce derivative samples; and encoding the derivative samples to form the encoded downsampled signal samples.

12. The method of claim 1, further comprising the following steps prior to the step of downsampling:

reordering the signal samples to form at least one set of demultiplexed signal samples; and inverting selected samples in each set of demultiplexed signal samples to form a corresponding set of demultiplexed input samples, wherein the step of downsampling is applied to each set of demultiplexed input samples to form a corresponding set of downsampled demultiplexed samples.

13. The method of claim 12, wherein the step of encoding the downsampled signal samples further comprises:

applying Huffman encoding to each set of downsampled demultiplexed samples to form a corresponding set of encoded downsampled signal samples included in the compressed samples.

14. The method of claim 12, wherein the step of encoding the downsampled signal samples further comprises:

calculating first or higher order derivatives of each set of downsampled demultiplexed samples to produce a corresponding set of derivative samples; and encoding each set of derivative samples to form the encoded downsampled signal samples included in the compressed samples.

15. The method of claim 12, wherein the step of upsampling is applied to each set of downsampled demultiplexed samples to form a corresponding set of upsampled demultiplexed samples, wherein the step of subtracting subtracts each set of upsampled demultiplexed samples from the corresponding set of demultiplexed input samples to form a corresponding set of error samples, wherein the step of encoding the error samples is applied to each set of error samples to form the encoded error samples included in the compressed samples.

16. The method of claim 12, further including at least one of a reordering control parameter and an inversion control parameter, wherein the step of reordering is performed in accordance with the reordering control parameter, wherein the step of inverting is performed in accordance with the inversion control parameter.

17. The method of claim 1, wherein the control function includes a ratio parameter that represents a relationship between a first change value corresponding to the sample rate control parameter and a second change value corresponding to the compression control parameter, wherein the step of setting a characteristic of a control function includes setting a value for the ratio parameter, wherein the step of applying the control function determines the sample rate control parameter and the compression control parameter in accordance with the value of the ratio parameter.

18. The method of claim 1, wherein the step of setting a characteristic of a control function further comprises:

representing the control function with a lookup table in memory, wherein the lookup table includes a first set of parameters corresponding to the sample rate control parameter and a second set of parameters corresponding to the compression control parameter; and selecting a first parameter from the first set and a second parameter from the second set, wherein the step of applying the control function determines the sample rate control parameter in accordance with the first parameter and the compression control parameter in accordance with the second parameter.

19. The method of claim 1, wherein the sampled input signal is an output of an analog to digital converter.

20. The method of claim 1, further comprising:

transferring the compressed sample to an interface or to storage; and decompressing the compressed samples received from the interface or storage, the decompressing comprising:

decoding the compressed samples including decoding the encoded downsampled signal samples and decoding the encoded error samples to produce decoded downsampled signal samples and decoded error samples, respectively;

upsampling the decoded downsampled signal samples to form reconstructed upsampled signal samples having the sample rate; and adding the reconstructed upsampled signal samples to the corresponding decoded error samples to form reconstructed signal samples corresponding to the plurality of signal samples.

21. The method of claim 20, wherein the reconstructed signal samples are provided to an input of a digital to analog converter.

22. An integrated circuit device including one or more integrated circuit chips, comprising a substrate including one or more integrated circuit chips;

memory on the substrate;

logic on the substrate configured to receive as input a characteristic of a control function and set the characteristic in the memory;

a controller on the substrate coupled to the memory to apply the control function to determine a sample rate control parameter and a compression control parameter in accordance with the characteristic of the control function;

a data channel on the substrate carrying a sampled input signal having a plurality of signal samples with a dynamic range and a sample rate;

a downsampler on the substrate coupled to the data channel to downsample the signal samples to form downsampled signal samples having a reduced sample rate, the downsampler responding to the controller to downsample in accordance with the sample rate control parameter;

an upsampler on the substrate coupled to the downsampler to upsample the downsampled signal samples to form upsampled signal samples having the sample rate, wherein the upsampled signal samples are approximations of corresponding signal samples in the plurality of signal samples;

a delay buffer on the substrate coupled to the data channel to store the signal samples for time alignment with the upsampled signal samples to produce time-aligned signal samples;

a subtractor on the substrate coupled to the delay buffer and coupled to the upsampler for subtracting the upsampled signal samples from the corresponding time-aligned signal samples to form error samples; and an encoder on the substrate coupled to the downsampler to encode the downsampled signal samples and coupled to the subtractor to encode the error samples, the encoder responding to the controller to encode in accordance with the compression control parameter, wherein the encoder produces encoded downsampled signal samples and encoded error samples to form a plurality of compressed samples.

23. The integrated circuit device of claim 22, wherein the downsampler further comprises a downsampling Farrow filter and the upsampler further comprises an upsampling Farrow filter.

24. The integrated circuit device of claim 22, wherein the downsampler further comprises a downsampling polyphase filter and the upsampler further comprises an upsampling polyphase filter.

25. The integrated circuit device of claim 22, further comprising:

an analog to digital converter on the substrate coupled to the data channel to provide the sampled input signal; and an analog input channel coupled to the analog to digital converter to provide an input analog signal, wherein the analog to digital converter converts the input analog signal to the sampled input signal.

* * * * *